US009815930B2

(12) United States Patent
Thackeray et al.

(10) Patent No.: US 9,815,930 B2
(45) Date of Patent: Nov. 14, 2017

(54) BLOCK COPOLYMER AND ASSOCIATED PHOTORESIST COMPOSITION AND METHOD OF FORMING AN ELECTRONIC DEVICE

(71) Applicants: The University of Queensland, St. Lucia (AU); Rohm and Haas Electronic Materials LLC, Marlborough, MA (US)

(72) Inventors: James W. Thackeray, Braintree, MA (US); Ke Du, Queensland (AU); Peter Trefonas, III, Medway, MA (US); Idriss Blakey, Clayfield (AU); Andrew Keith Whittaker, Toowong (AU)

(73) Assignees: ROHM AND HAAS ELECTRONIC MATERIALS LLC, Marlborough, MA (US); THE UNIVERSITY OF QUEENSLAND, St Lucia (AU)

( * ) Notice: Subject to any disclaimer, the term of this patent is extended or adjusted under 35 U.S.C. 154(b) by 0 days.

(21) Appl. No.: 14/820,647

(22) Filed: Aug. 7, 2015

(65) Prior Publication Data
US 2017/0037178 A1  Feb. 9, 2017

(51) Int. Cl.
| C08F 293/00 | (2006.01) |
| G03F 7/038 | (2006.01) |
| G03F 7/20 | (2006.01) |
| G03F 7/32 | (2006.01) |
| G03F 7/004 | (2006.01) |
| G03F 7/039 | (2006.01) |
| G03F 7/075 | (2006.01) |
| C08F 220/22 | (2006.01) |
| C09D 153/00 | (2006.01) |
| G03F 7/11 | (2006.01) |

(52) U.S. Cl.
CPC .......... *C08F 293/00* (2013.01); *C08F 220/22* (2013.01); *C08F 293/005* (2013.01); *C09D 153/00* (2013.01); *G03F 7/0046* (2013.01); *G03F 7/038* (2013.01); *G03F 7/0382* (2013.01); *G03F 7/0392* (2013.01); *G03F 7/0758* (2013.01); *G03F 7/2004* (2013.01); *G03F 7/2059* (2013.01); *G03F 7/322* (2013.01); *C08F 2438/03* (2013.01); *G03F 7/0048* (2013.01); *G03F 7/11* (2013.01)

(58) Field of Classification Search
CPC .. C08F 293/00; C08F 220/22; C08F 293/005; C08F 2438/03; G03F 7/0392; G03F 7/0382; G03F 7/0758; G03F 7/0046; G03F 7/038; G03F 7/0048; G03F 7/11; G03F 7/322; G03F 7/2004; G03F 7/2059; C09D 153/00
See application file for complete search history.

(56) References Cited

U.S. PATENT DOCUMENTS

| 2,760,863 | A |  | 8/1956 | Plambeck, Jr. |
| 2,850,445 | A |  | 9/1958 | Oster |
| 2,875,047 | A |  | 2/1959 | Oster |
| 3,097,096 | A |  | 7/1963 | Oster |
| 3,427,161 | A |  | 2/1969 | Laridon et al. |
| 3,479,185 | A |  | 11/1969 | Chambers, Jr. |
| 3,549,367 | A |  | 12/1970 | Chang et al. |
| 4,343,885 | A |  | 8/1982 | Reardon, Jr. |
| 4,442,197 | A |  | 4/1984 | Crivello et al. |
| 4,603,101 | A |  | 7/1986 | Crivello |
| 4,624,912 | A |  | 11/1986 | Zweifel et al. |
| 7,666,572 | B2 |  | 2/2010 | Harada et al. |
| 8,431,325 | B2 |  | 4/2013 | Hashimoto et al. |
| 8,618,217 | B2 |  | 12/2013 | Kanna |
| 8,846,303 | B2 |  | 9/2014 | Hatakeyama et al. |
| 8,846,838 | B2 |  | 9/2014 | Matsumiya et al. |
| 8,883,400 | B2 |  | 11/2014 | Wang et al. |
| 8,945,808 | B2 |  | 2/2015 | David et al. |
| 2006/0210715 | A1 | * | 9/2006 | Amin-Sanayei ....... B05D 5/083 427/372.2 |
| 2007/0149703 | A1 | * | 6/2007 | Caprasse .................. A61K 8/06 524/588 |
| 2007/0231713 | A1 |  | 10/2007 | Bristol |
| 2007/0231751 | A1 |  | 10/2007 | Bristol et al. |
| 2008/0038676 | A1 |  | 2/2008 | Li et al. |
| 2008/0193879 | A1 |  | 8/2008 | Allen et al. |

(Continued)

FOREIGN PATENT DOCUMENTS

| JP | 2014174329 A |  | 9/2014 |
| WO | 2012081863 A2 |  | 6/2012 |
| WO | WO-2013/036555 A1 | * | 3/2013 |

OTHER PUBLICATIONS

Gabor et al , Proc. SPIE vol. 2724, Advances in Resist Technology and Processing XIII, 410-417 (Jun. 14, 1996); doi: 10.1117/12. 241839.*
English translation of WO 2012/081863 A obtained from PAtentscope , WIPO website. 22 pages. obtained Jan. 24, 2017.*
Owens et al "Estimation of the Surface Free Engergy of Polymers", Journal of Applied POlymer Science, vol. 13, pp. 1741-1747 (1969).*
Fujitani et al., "OBPL for the Best Solution to Resist Outgassing and Out-of-Band Issues in EUVL toward 1Xnm hp" Proc. of SPIE, vol. 9048 (2014) 90482H-1-90482H-7.

(Continued)

*Primary Examiner* — Cynthia Hamilton
(74) *Attorney, Agent, or Firm* — Cantor Colburn LLP

(57) ABSTRACT

A block copolymer useful in electron beam and extreme ultraviolet photolithography includes a first block with units derived from a base-solubility-enhancing monomer and an out-of-band absorbing monomer, and a second block having a low surface energy. Repeat units derived from the out-of-ban absorbing monomer allow the copolymer to absorb significantly in the wavelength range 150 to 400 nanometers. When incorporated into a photoresist composition with a photoresist random polymer, the block copolymer self-segregates to form a top layer that effectively screens out-of-band radiation.

12 Claims, 7 Drawing Sheets

(56) References Cited

U.S. PATENT DOCUMENTS

| | | | |
|---|---|---|---|
| 2008/0311530 | A1 | 12/2008 | Allen et al. |
| 2009/0087799 | A1 | 4/2009 | Tachibana et al. |
| 2010/0173245 | A1 | 7/2010 | Wang et al. |
| 2011/0245395 | A1 | 10/2011 | Komoriya et al. |
| 2012/0021355 | A1 | 1/2012 | Kim et al. |
| 2012/0328983 | A1 | 12/2012 | Kramer |
| 2013/0059252 | A1 | 3/2013 | Maruyama et al. |
| 2013/0062581 | A1* | 3/2013 | May .................. C09D 5/24 252/519.3 |
| 2013/0071789 | A1* | 3/2013 | Iwashita .............. G03F 7/0045 430/285.1 |
| 2013/0115553 | A1 | 5/2013 | Wang |
| 2013/0137035 | A1* | 5/2013 | Wang .................. G03F 7/0045 430/270.1 |
| 2013/0143162 | A1 | 6/2013 | Hatakeyama et al. |
| 2013/0337379 | A1 | 12/2013 | Yao et al. |
| 2014/0199617 | A1* | 7/2014 | Tsubaki ............... G03F 7/0045 430/18 |
| 2015/0140484 | A1* | 5/2015 | Takizawa ............. C08F 212/14 430/18 |
| 2017/0037171 | A1 | 2/2017 | Thackeray et al. |

OTHER PUBLICATIONS

Hagiwara et al.; "Surface Segregation Analysis of Hydrophobic Additive of Non-topcoat Resist"; Journal of Photopolymer Science and Technology; vol. 21; No. 5; 2008; pp. 647-654.

Kim et al.; "CD uniformity imporvement for EUV resists process: EUV resolution enhancement layer"; Samsung Electronics, Co. Ltd., Semiconductor R&D Center, Process Devel. Team; 2011; http://proceedings.spiedigitallibrary.org on Apr. 23, 2015.

Ohmori et al., "Progress of Topcoat and Resist Development for 193nm Immersion Lithography" Proc. of SPIE vol. 6513 (2006) 61531X-1-61531X-8.

Onishi et al., "The Novel Top-Coat Material for RLS Trade-off Reduction in EUVL" Proc. of SPIE vol. 8322, (2012) 83222D-1-83222D-6.

Otake et al.; "Hydrophobic Surface Construction by Phase-Separation of Fluorinated Block Copolymer for Immersion Lithography"; Journal of Photopolymer Science and Technology; vol. 21; No. 5; 2008; pp. 679-684.

Sheehan et al.; "RAFT Technology for the Production of Advanced Photoresist Polymers"; E.I. DuPont de Nemours, Central Research and Development; 2008; 14 pages.

Solid surface energy data (SFE) for common polymers; Nov. 20, 2007, http://www.surface-tension.de/solid-surface-energy.html [Apr. 30, 2015 12:03:34 PM]; 2 pages.

Non-Final Office Action dated Dec. 16, 2016; U.S. Appl. No. 14/820,699, filed Aug. 7, 2015 (20 pages).

Non-Final Office Action dated Dec. 16, 2017; U.S. Appl. No. 14/820,699, filed Aug. 7, 2015 (20 pages).

Final Office Action dated Jun. 29, 2017; U.S. Appl. No. 14/820,699, filed Aug. 7, 2015 (6 pages).

\* cited by examiner

US 9,815,930 B2

BLOCK COPOLYMER AND ASSOCIATED PHOTORESIST COMPOSITION AND METHOD OF FORMING AN ELECTRONIC DEVICE

FIELD

The present invention relates to block copolymers useful as components of photoresist compositions.

INTRODUCTION

Extreme ultraviolet (EUV) lithography and electron-beam lithography are promising technologies for patterning at scales of 20 nanometers and less. Sources of EUV radiation also produce longer wavelength radiation—so-called out-of-band (OOB) radiation—that can significantly deteriorate imaging performance. There is therefore a need for photoresist compositions that can reduce the negative impact of out-of-band radiation without unduly compromising other photolithographic responses.

SUMMARY

One embodiment is a block copolymer comprising: a first block comprising repeat units derived from an out-of-band absorbing monomer that excludes fluorine-substituted ester groups, and a base-solubility-enhancing monomer; and a second block having a surface energy of 15 to 34 millijoules per meter$^2$; wherein a film cast from the block copolymer has an extinction coefficient, k, of 0.1 to 0.5 at a wavelength in the range of 150 to 400 nanometers.

Another embodiment is photoresist composition comprising the block copolymer.

Another embodiment is a film comprising the photoresist composition.

Another embodiment is a method of forming an electronic device, comprising: (a) applying a layer of the photoresist composition on a substrate; (b) pattern-wise exposing the photoresist composition layer to electron beam or extreme ultraviolet radiation; and (c) developing the exposed photoresist composition layer to provide a resist relief image.

These and other embodiments are described in detail below.

BRIEF DESCRIPTION OF THE DRAWINGS

FIG. 7A shows a scores plot of positive mass spectra on PC1 and PC2 for CBP-4 (#1), CBP-4+10% Poly(ECPMA$_{32}$-co-BzMA$_{34}$)-b-(MA-4-HFA-CHOH)$_{26}$ (#4) and Poly(ECPMA$_{32}$-co-BzMA$_{34}$)-b-(MA-4-HFA-CHOH)$_{26}$ (#6). FIG. 7B shows the intensity of the CF$_3^+$ fragments for samples #1, #4, and #6. FIG. 7C shows statistically evaluated intensities of C$_9$H$_{11}^+$ for #1, #4, and #6.

DETAILED DESCRIPTION

Figure 1:
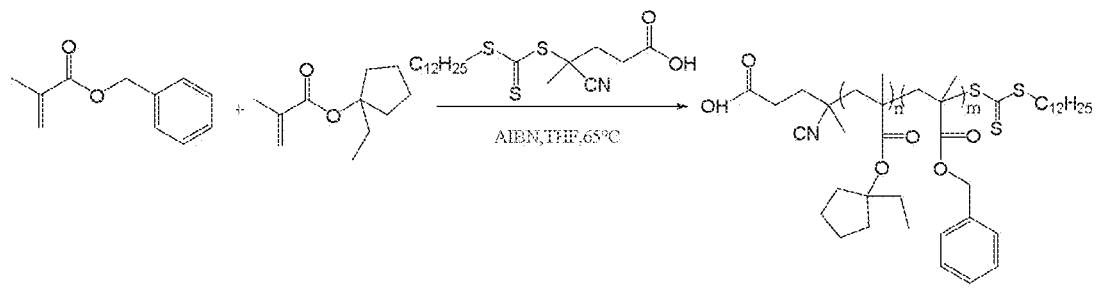
FIG. 1 is a reaction scheme for the reversible addition-fragmentation chain transfer (RAFT) synthesis of poly (ECPMA-co-BzMA).

The present inventors have determined that the negative impact of out-of-band radiation can be reduced by incorporating into a photoresist composition a particular block copolymer. The block copolymer includes a first block with repeat units derived from an out-of-band absorbing monomer and a base-solubility enhancing monomer, and a second block with a low surface energy. When a photoresist composition comprising a photoresist random copolymer and the block copolymer is coated on a substrate and dried, the block copolymer self-segregates from the random copolymer and forms a top layer that effectively blocks out-of-band radiation.

As used herein, the term "(meth)acrylate" means acrylate or methacrylate.

As used herein, the term "hydrocarbyl", whether used by itself, or as a prefix, suffix, or fragment of another term, refers to a residue that contains only carbon and hydrogen unless it is specifically identified as "substituted hydrocarbyl". The hydrocarbyl residue can be aliphatic or aromatic, straight-chain, cyclic, bicyclic, branched, saturated, or unsaturated. It can also contain combinations of aliphatic, aromatic, straight chain, cyclic, bicyclic, branched, saturated, and unsaturated hydrocarbon moieties. When the hydrocarbyl residue is described as substituted, it can contain heteroatoms in addition to carbon and hydrogen.

Except where otherwise specified, the term "substituted" means including at least one substituent such as a halogen (i.e., F, Cl, Br, I), hydroxyl, amino, thiol, carboxyl, carboxylate, ester (including acrylates, methacrylates, and lactones), amide, nitrile, sulfide, disulfide, nitro, C$_{1-18}$ alkyl, C$_{1-18}$ alkenyl (including norbornenyl and adamantyl), $C_{1-18}$ alkoxyl, $C_{2-18}$ alkenoxyl (including vinyl ether), $C_{6-18}$ aryl, $C_{6-18}$ aryloxyl, $C_{7-18}$ alkylaryl, or $C_{7-18}$ alkylaryloxyl.

As used herein, the term "fluorinated" shall be understood to mean having one or more fluorine atoms incorporated into the group. For example, where a $C_{1-18}$ fluoroalkyl group is indicated, the fluoroalkyl group can include one or more fluorine atoms, for example, a single fluorine atom, two fluorine atoms (e.g., as a 1,1-difluoroethyl group), three fluorine atoms (e.g., as a 2,2,2-trifluoroethyl group), or fluorine atoms at each free valence of carbon (e.g., as a perfluorinated group such as —$CF_3$, —$C_2F_5$, —$C_3F_7$, or —$C_4F_9$).

As used herein, the term "alkyl" includes linear alkyl, branched alkyl, cyclic alkyl, and alkyl groups combining two-way and three-way combinations of linear, branched, and cyclic groups. The alkyl groups can be unsubstituted or substituted. Specific examples of alkyl groups include methyl, ethyl, 1-propyl, 2-propyl, cyclopropyl, 1-butyl, 2-butyl, 2-methyl-1-propyl, tertiary-butyl, cyclobutyl, 1-methylcyclopropyl, 2-methylcyclopropyl, 1-pentyl, 2-pentyl, 3-pentyl, 2-methyl-1-butyl, 3-methyl-1-butyl, 2-methyl-2-butyl, 3-methyl-2-butyl, 2,2-dimethyl-1-propyl (neopentyl), cyclopentyl, 1-methylcyclobutyl, 2-methylcyclobutyl, 3-methylcyclobutyl, 1,2-dimethylcyclopropyl, 2,2-dimethylcyclopropyl, 2,3-dimethylcyclopropyl, 1-hexyl, 2-hexyl, 3-hexyl, 2-methyl-1-pentyl, 3-methyl-1-pentyl, 4-methyl-1-pentyl, 2-methyl-2-pentyl, 4-methyl-2-pentyl, 2-methyl-3-pentyl, 3-methyl-2-pentyl, 3-methyl-3-pentyl, 2,2-dimethyl-1-butyl, 3,3-dimethyl-1-butyl, 3,3-dimethyl-2-butyl, 2,3-dimethyl-1-butyl, 2,3-dimethyl-2-butyl, 1,2,2-trimethylcyclopropyl, 2,2,3-trimethylcyclopropyl, (1,2-dimethylcyclopropyl)methyl, (2,2-dimethylcyclopropyl)methyl, 1,2,3-trimethylcyclopropyl, (2,3-dimethylcyclopropyl) methyl, 2,2-dimethylcyclobutyl, 2,3-dimethylcyclobutyl, (1-methylcyclobutyl)methyl, 1,2-dimethylcyclobutyl, 2,3-dimethylcyclobutyl, (2-methylcyclobutyl)methyl, 1,3-dimethylcyclobutyl, 2,4-dimethylcyclobutyl, (3-methylcyclobutyl)methyl, 1-methylcyclopentyl, 2-methylcyclopentyl, cyclopentylmethyl, cyclohexyl, 1-norbornyl, 2-norbornyl, 3-norbornyl, 1-adamantyl, 2-adamantyl, octahydro-1-pentalenyl, octahydro-2-pentalenyl, octahydro-3-pentalenyl, octahydro-1-phenyl-1-pentalenyl, octahydro-2-phenyl-2-pentalenyl, octahydro-1-phenyl-3-pentalenyl, octahydro-2-phenyl-3-pentalenyl, decahydro-1-naphthyl, decahydro-2-naphthyl, decahydro-3-naphthyl, decahydro-1-phenyl-1-naphthyl, decahydro-2-phenyl-2-naphthyl, decahydro-1-phenyl-3-naphthyl, and decahydro-2-phenyl-3-naphthyl.

One embodiment is a block copolymer comprising: a first block comprising repeat units derived from an out-of-band absorbing monomer that excludes fluorine-substituted ester groups, and a base-solubility-enhancing monomer; and a second block having a surface energy of 15 to 34 millijoules per meter$^2$; wherein a film cast from the block copolymer has an extinction coefficient, k, of 0.1 to 0.5 at a wavelength in the range of 150 to 400 nanometers.

The first block comprises repeat units derived from an out-of-band absorbing monomer. As used herein, the term "out-of-band absorbing monomer" means a monomer that absorbs radiation at longer wavelengths than the radiation intended to expose the photoresist. For example, if the exposure device uses extreme ultraviolet radiation at a wavelength of 13.5 nanometers, then a monomer that absorbs ultraviolet radiation in the wavelength range 150 to 400 nanometers, specifically 190 to 300 nanometers, would be an out-of-band absorbing monomer. The "out-of-band absorbing monomer" provides the copolymer with absorbance in the range 150 to 400 nanometers. Specifically, a film cast from the block copolymer has an extinction coefficient, k, of 0.1 to 0.5 at a wavelength (i.e., at least one wavelength) in the range of 150 to 400 nanometers. In some embodiments, the maximum value of the extinction coefficient, k, in the range 150 to 400 nanometers, is 0.1 to 0.5. It will be understood that the extinction coefficient, k, can be less than 0.1 and even zero at some wavelengths in the range 150 to 400 nanometers. The out-of-band absorbing monomer excludes fluorine-substituted ester groups. In some embodiments, the out-of-band absorbing monomer comprises an unsubstituted or substituted $C_6$-$C_{18}$ aryl group that is free of fluorine, an unsubstituted or substituted $C_2$-$C_{17}$ heteroaryl group, a $C_5$-$C_{12}$ dienone group, or a combination thereof.

In some embodiments, the out-of-band absorbing monomer has the structure

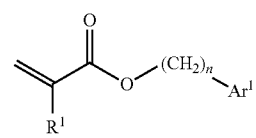

wherein $R^1$ is hydrogen or methyl; n is 0, 1, 2, 3, or 4; and $Ar^1$ is an unsubstituted or substituted $C_6$-$C_{18}$ aryl group, provided that the substituted $C_6$-$C_{18}$ aryl group is free of fluorine.

Specific examples of out-of-band absorbing monomers include

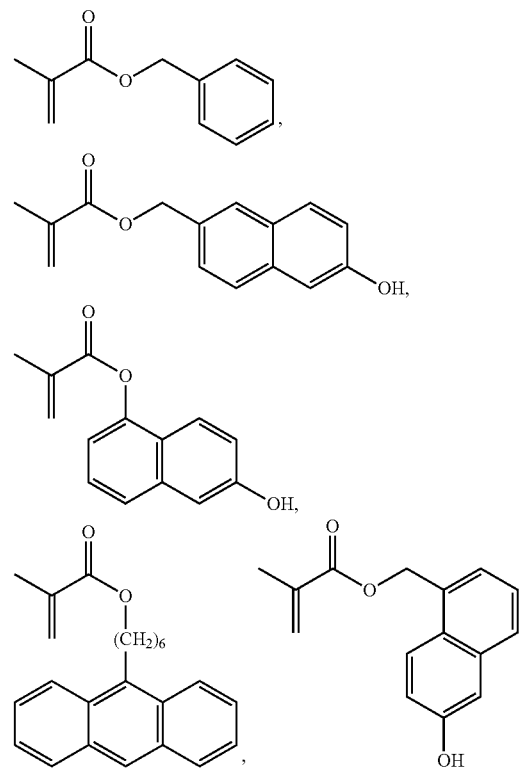

and combinations thereof.

The first block can comprise repeat units derived from the out-of-band absorbing monomer in an amount of 10 to 90 mole percent, based on the total moles of repeat units in the first block. Within this range, the content of repeat units derived from the out-of-band absorbing monomer can be 20 to 80 mole percent, specifically 30 to 70 mole percent.

The block copolymer can comprise repeat units derived from the out-of-band absorbing monomer in an amount of 5 to 70 mole percent, based on the total moles of repeat units in the block copolymer. Within this range, the content of repeat units derived from the out-of-band absorbing monomer can be 10 to 60 mole percent, specifically 20 to 50 mole percent.

In addition to repeat units derived from the out-of-band absorbing monomer, the first block comprises repeat units derived from a base-solubility-enhancing monomer. Classes of base-solubility-enhancing monomers include acid-labile (meth)acrylate esters, base-labile (meth)acrylate esters, (meth)acrylate esters substituted with a group having a $pK_a$ of 2 to 12, and combinations thereof.

In some embodiments, the base-solubility-enhancing monomer comprises a tertiary (meth)acrylate ester. Tertiary (meth)acrylate esters include, for example,

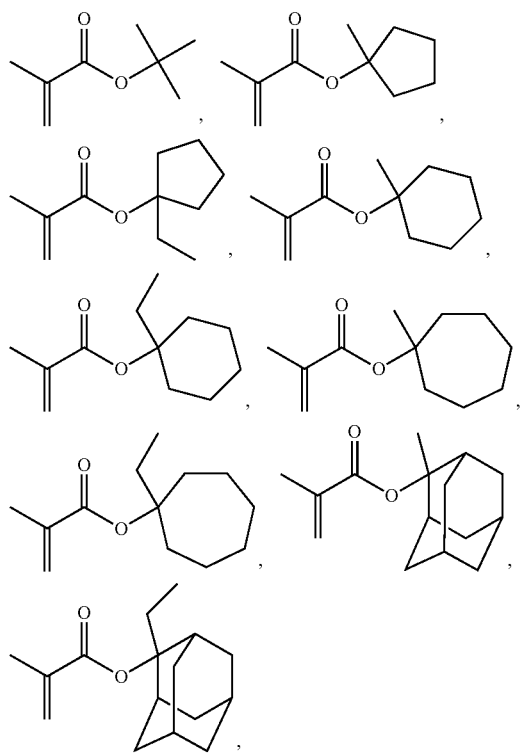

and combinations thereof.

Acid-labile (meth)acrylate esters further include (meth)acrylate esters substituted with acetal and/or ketal groups. Such monomers include, for example,

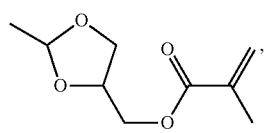

-continued

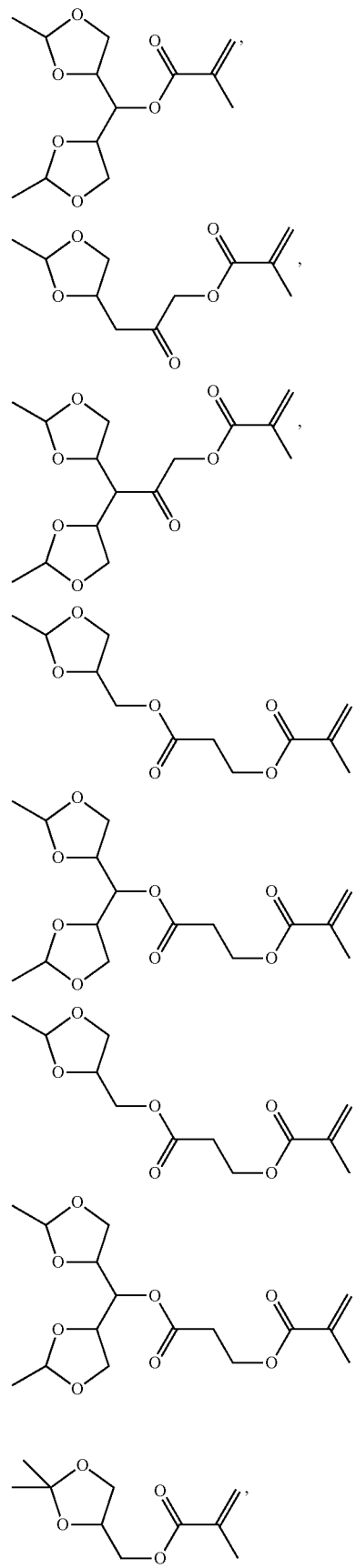

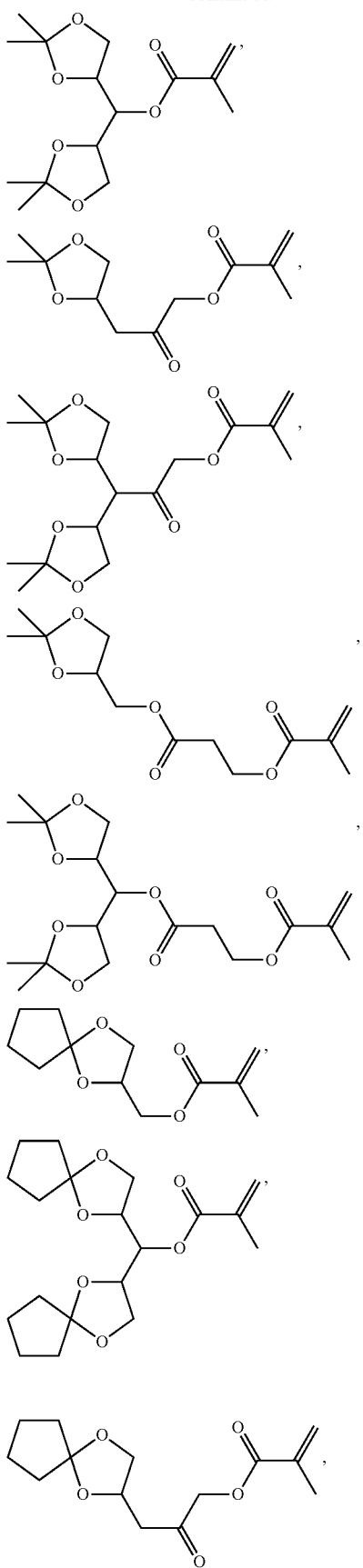
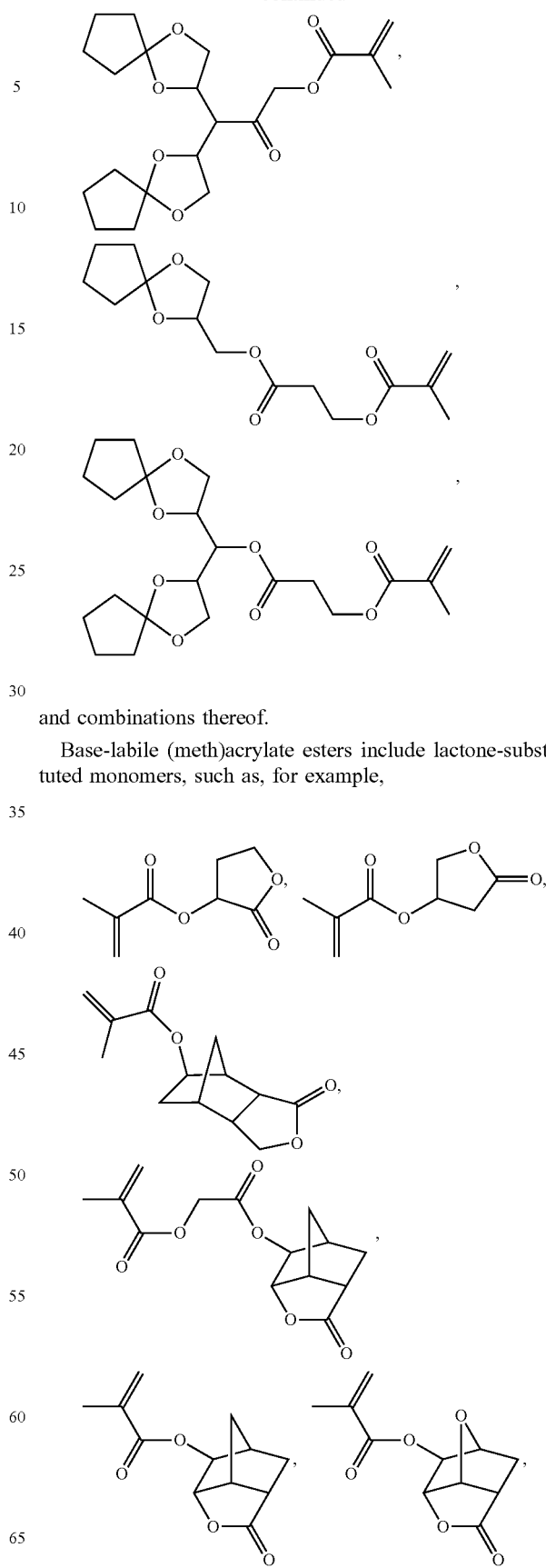
and combinations thereof.
Base-labile (meth)acrylate esters include lactone-substituted monomers, such as, for example,

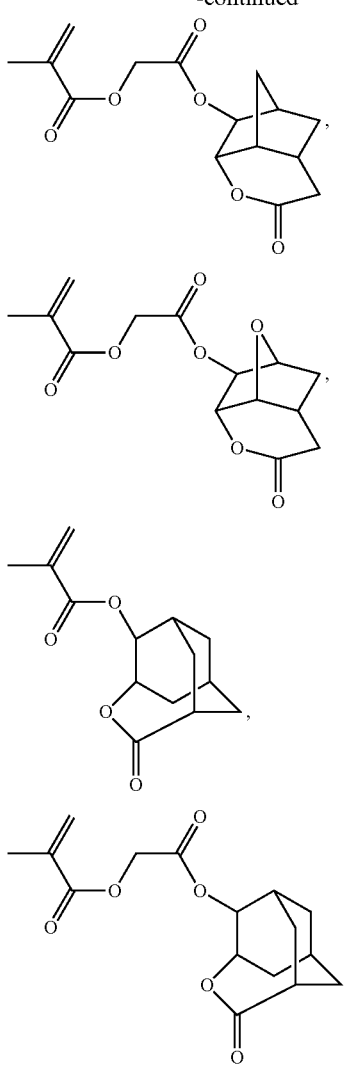

and combinations thereof.

(Meth)acrylate esters substituted with a group having a pK$_a$ of 2 to 12 include (meth)acrylate esters substituted with carboxylic acids, phenols, arylsulfonic acids, phthalimides, sulfonamides, sulfonimides, and alcohols. Those skilled in the art can readily determine if a particular species comprising one of these acidic functional groups has a pK$_a$ value in the range of 2 to 12. Specific examples of (meth)acrylate esters substituted with a group having a pK$_a$ of 2 to 12 include, for example,

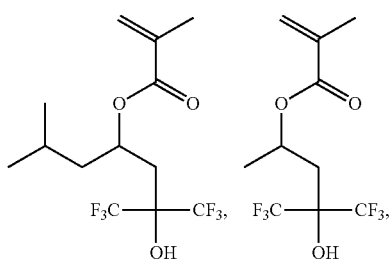

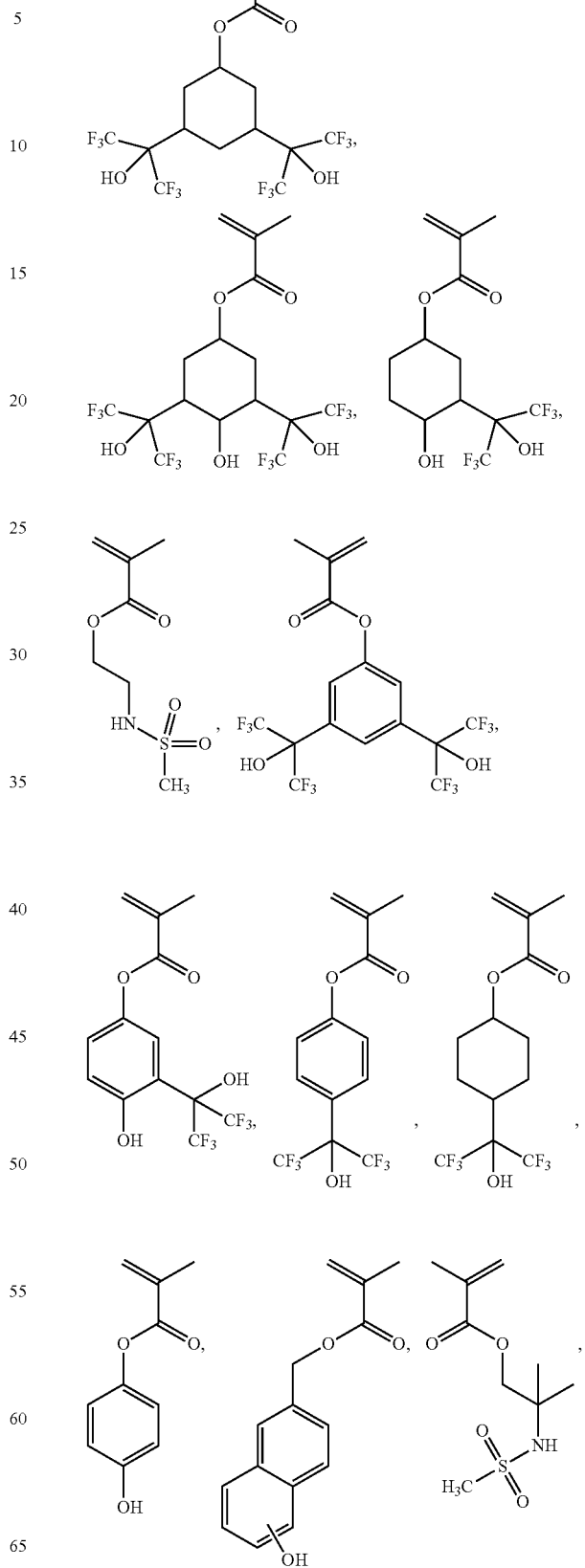

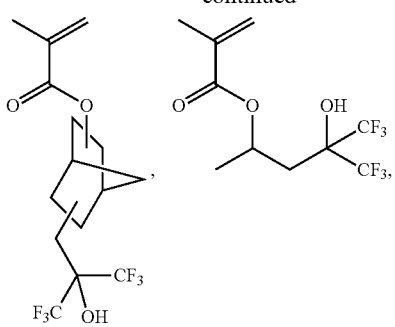

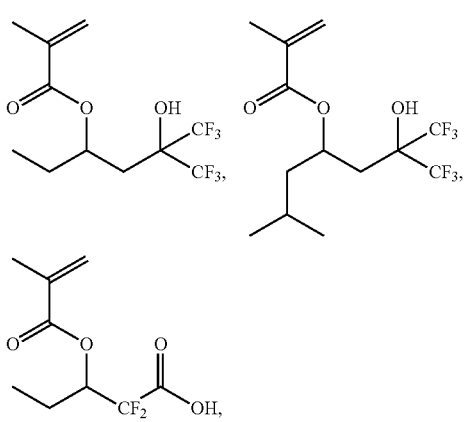

and combinations thereof.

The first block can comprise repeat units derived from the base-solubility-enhancing monomer in an amount of 10 to 90 mole percent, based on the total moles of repeat units in the first block. Within this range, the content of repeat units derived from the base-solubility-enhancing monomer can be 20 to 80 mole percent, specifically 30 to 70 mole percent.

The block copolymer can comprise repeat units derived from the base-solubility-enhancing monomer in an amount of 5 to 70 mole percent, based on the total moles of repeat units in the block copolymer. Within this range, the content of repeat units derived from the base-solubility-enhancing monomer can be 10 to 60 mole percent, specifically 20 to 50 mole percent.

In addition to repeat units derived from the out-of-band absorbing monomer and the base-solubility-enhancing monomer, the first block can, optionally, further comprise repeat units derived from a photoacid-generating monomer. Any photoacid-generating monomer useful for forming an EUV photoresist copolymer can be used. Illustrative examples of such monomers include

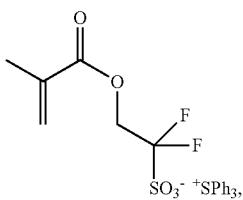

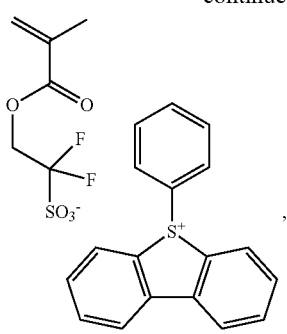

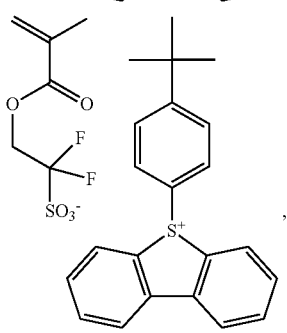

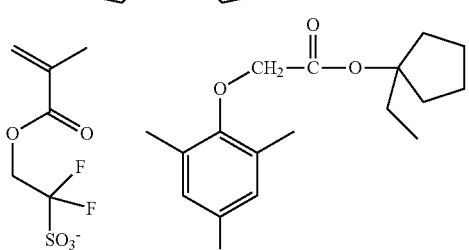

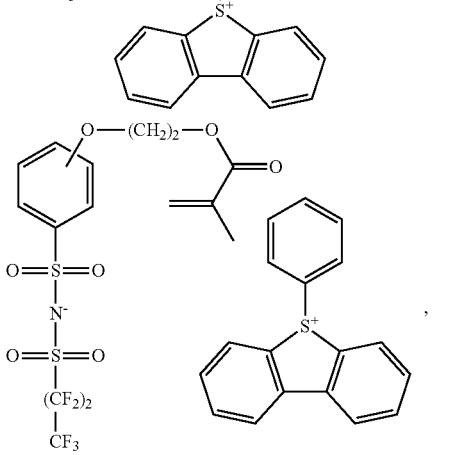

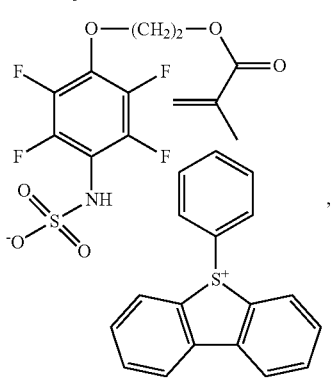

-continued

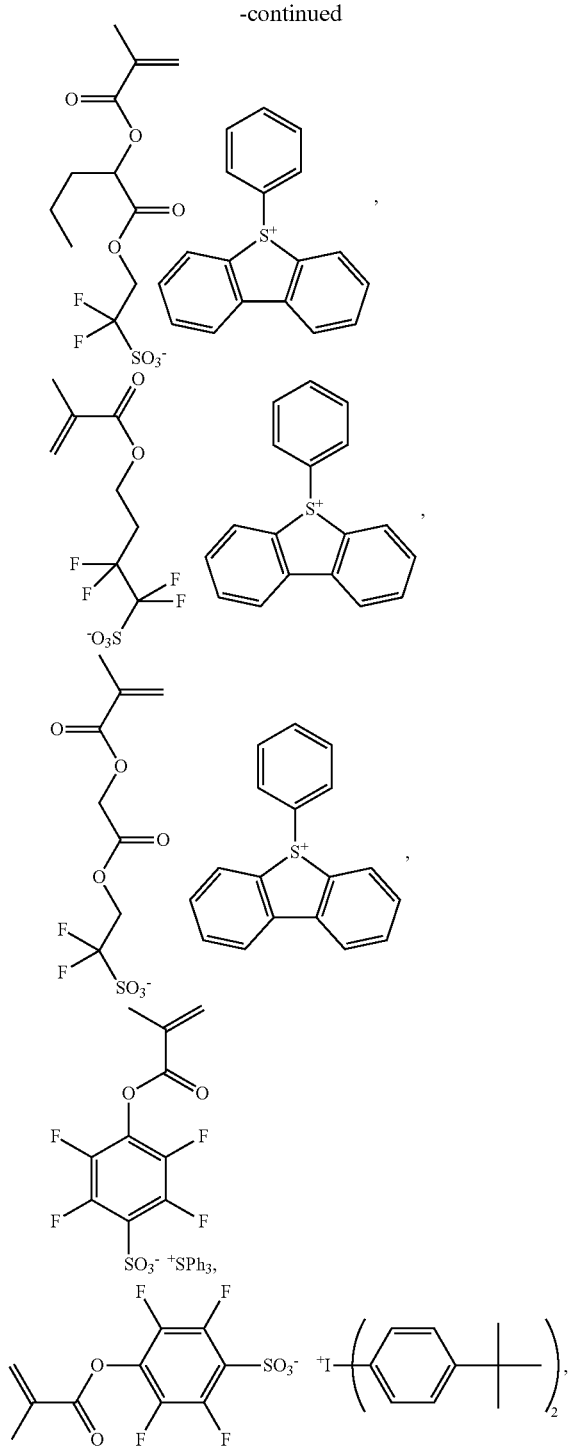

and combinations thereof.

When the first block comprises repeat units derived from a photoacid-generating monomer, they can be present in an amount of 2 to 20 mole percent, based on the total moles of repeat units in the first block. Within this range, the content of repeat units derived from the photoacid-generating monomer can be 4 to 15 mole percent, specifically 5 to 12 mole percent.

The block copolymer can, optionally, comprise repeat units derived from the photoacid-generating monomer in an amount of 1 to 15 mole percent, based on the total moles of repeat units in the block copolymer. Within this range, the content of repeat units derived from the base-solubility-enhancing monomer can be 2 to 13 mole percent, specifically 3 to 12 mole percent.

The second block has a low surface energy. Specifically, the second block has a surface energy of 15 to 34 millijoules per meter$^2$, determined using the Owens-Wendt method from the contact angles of water (18 ohm deionized water), methylene iodide ($CH_2I_2$), and diethylene glycol, which are measured on a contact angle goniometer by the Sessile Drop method. Within the range of 15 to 34 millijoules per meter$^2$, the surface energy can be 15 to 30 millijoules per meter$^2$, specifically 15 to 26 millijoules per meter$^2$.

In some embodiments, the second block is the product of polymerizing a monomer comprising a polymerizable moiety a low surface energy moiety. There is no particular limit on the type of polymer used for the second block. For example, when the second block is a polyester block, the polymerizable moiety can be a dialcohol, a dicarboxylic acid, or a diester. When the second block is a polyurethane block, the polymerizable moiety can be a diisocyanate, a dialcohol, or a combination of an isocyanate and an alcohol. When the second block is a polycarbonate block, the polymerizable moiety can be a dialcohol (which forms a polycarbonate via reaction with a carbonate precursor such as phosgene or dimethylcarbonate or diphenylcarbonate). When the second block is a polysilane, the polymerizable moiety can be a dichloro dihydrocarbyl silane (which forms a polysilane via reductive polymerization with a reagent such as metallic sodium). When the second block is a polydiacetylene, the polymerizable moiety can be a diacetylene group. When the second block is a polyether, the polymerizable moiety can be a glycidyl group. When the second block is a poly(phenylene ether), the polymerizable moiety can be a phenolic (hydroxyphenyl) group. When the second block is a polyvinyl polymer, the polymerizable moiety can be a vinyl group. When the second block is a polyallyl polymer, the polymerizable moiety can be an allyl group. When the second block is a polynorbornene, the polymerizable moiety can be a norbornene group. When the second bock is a poly((meth)acrylate), the polymerizable moiety can be a (meth)acryloyl group.

The monomer used to form the second block comprises a low surface energy moiety. Examples of low surface energy moieties include $C_{10}$-$C_{36}$ alkyls, $C_2$-$C_{12}$ dialkylsiloxanes, and $C_1$-$C_{12}$ fluorinated alkyls.

Classes of monomers useful for forming the low surface energy block include, for example, (meth)acrylate esters comprising at least one fluorine atom; (meth)acrylate esters comprising at least ten unsubstituted aliphatic carbon atoms; (meth)acrylate esters comprising a trialkylsilyl group, a trialkoxysilyl group, a dialkylsiloxane group, a trialkylsiloxane group, or a combination thereof; and combinations thereof.

The second block can comprise repeat units derived from a (meth)acrylate ester comprising at least one fluorine atom. In some embodiments, the (meth)acrylate ester comprising at least one fluorine atom has the structure

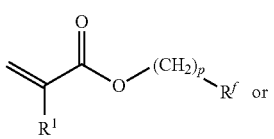

or

-continued

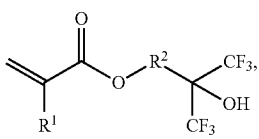

wherein p is 0, 1, 2, 3, or 4; $R^1$ is hydrogen or methyl; $R^2$ is an unsubstituted or substituted $C_1$-$C_{18}$ hydrocarbylene group; and $R^f$ is a $C_1$-$C_{18}$ hydrocarbyl group substituted with at least one fluorine atom and, optionally, further substituted with substituents other than fluorine.

Specific examples of (meth)acrylate esters comprising at least one fluorine atom include

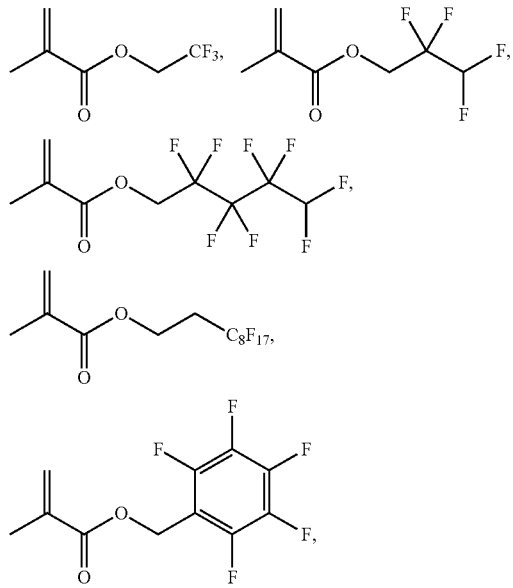

and combinations thereof.

The second block can comprise repeat units derived from a (meth)acrylate ester comprising at least ten unsubstituted aliphatic carbon atoms. Specific examples of such esters include

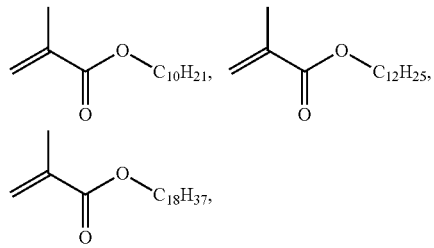

and combinations thereof.

The second block can comprise repeat units derived from a (meth)acrylate ester comprising a trialkylsilyl group, a trialkoxysilyl group, a dialkylsiloxane group, a trialkylsiloxane group, or a combination thereof. Specific examples of such esters include

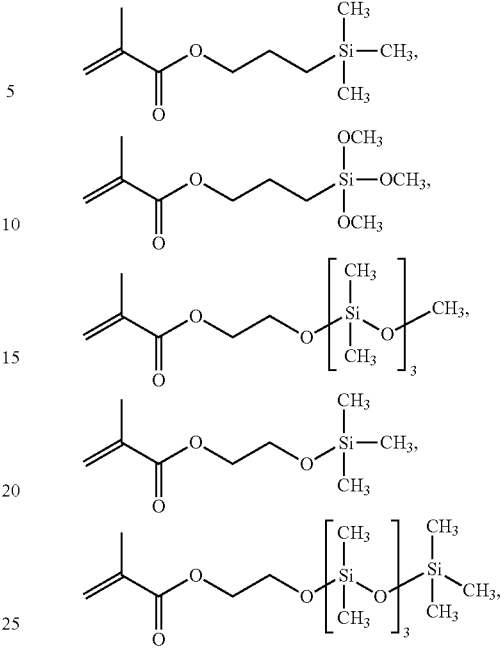

and combinations thereof.

The second block can comprise repeat units derived from the low surface energy monomer in an amount of 50 to 100 mole percent, based on the total moles of repeat units in the first block. Within this range, the content of repeat units derived from the low surface energy monomer can be 70 to 100 mole percent, specifically 90 to 100 mole percent.

The block copolymer can comprise repeat units derived from the low surface energy monomer in an amount of 10 to 70 mole percent, based on the total moles of repeat units in the block copolymer. Within this range, the content of repeat units derived from the low surface energy monomer can be 15 to 50 mole percent, specifically 20 to 40 mole percent.

There is no particular limitation on the molecular weight of the block copolymer. Molecular weight characteristics can be determined by size exclusion chromatography using polystyrene standards and tetrahydrofuran solvent. In some embodiments, the block copolymer has a number average molecular weight of 2,000 to 100,000 Daltons. Within this range, the number average molecular weight can be 3,000 to 60,000 Daltons, specifically 4,000 to 40,000 Daltons. Particularly when the block copolymer is prepared using the RAFT methods described herein, it can have a narrow molecular weight distribution. The molecular weight distribution can be characterized by the dispersity, which is the ratio of the weight average molecular weight to the number average molecular weight. In some embodiments, the block copolymer has a dispersity ($M_w/M_n$) of 1.05 to 1.2. Within this range, the dispersity can be 1.05 to 1.15. However, a narrow molecular weight distribution is not required for the block copolymer to function as intended. For example, in some embodiments, the block copolymer has a dispersity of 1.05 to 2.

In some embodiments, the block copolymer is purified using a method selected from the group consisting of precipitation, filtration, solvent exchange, centrifugation, decantation (including multiple decantations), ion exchange, and combinations thereof.

Another embodiment is a photoresist composition comprising the block copolymer in any of its above-described variations. In some embodiments, the block copolymer is the only polymer in the photoresist composition. In other embodiments, the photoresist composition comprises the block copolymer in combination with a random copolymer. Random photoresist copolymers are known in the art and can include repeat units derived from monomers including acid-labile monomers, base-labile monomers, monomers substituted with a group having a $pK_a$ of 2 to 12, and combinations thereof. The random photoresist copolymer can further comprise repeat units derived from a photoacid generating monomer.

When the photoresist composition comprises a random copolymer and the block copolymer, they can be used, for example, in a weight ratio of 2:1 to 50:1. Within this range, the weight ratio of the random copolymer to the block copolymer can be 4:1 to 40:1, specifically 5:1 to 30:1, more specifically 5:1 to 20:1.

The photoresist composition can further include one or more photoactive components such as photoacid generators, photobase generators, photoinitiators, additional (meth) acrylate-based polymers with or without bound photoacid generators, polyhydroxystyrene-based polymers with or without bound photoacid generators, and combinations thereof.

Photoacid generators generally include those photoacid generators suitable for the purpose of preparing photoresists. Photoacid generators include, for example, non-ionic oximes and various onium ion salts. Onium ions include, for example, unsubstituted and substituted ammonium ions, unsubstituted and substituted phosphonium ions, unsubstituted and substituted arsonium ions, unsubstituted and substituted stibonium ions, unsubstituted and substituted bismuthonium ions, unsubstituted and substituted oxonium ions, unsubstituted and substituted sulfonium ions, unsubstituted and substituted selenonium ions, unsubstituted and substituted telluronium ions, unsubstituted and substituted fluoronium ions, unsubstituted and substituted chloronium ions, unsubstituted and substituted bromonium ions, unsubstituted and substituted iodonium ions, unsubstituted and substituted aminodiazonium ions (substituted hydrogen azide), unsubstituted and substituted hydrocyanonium ions (substituted hydrogen cyanide), unsubstituted and substituted diazenium ions ($RN=N^+R_2$), unsubstituted and substituted iminium ions ($R_2C=N^+R_2$), quaternary ammonium ions having two double-bonded substituents ($R=N^+=R$), nitronium ion ($NO_2^+$), bis(triarylphosphine)iminium ions (($Ar_3P)_2N^+$), unsubstituted or substituted tertiary ammonium having one triple-bonded substituent ($R\equiv NH^+$), unsubstituted and substituted nitrilium ions ($RC\equiv NR^+$), unsubstituted and substituted diazonium ions ($N\equiv N^+R$), tertiary ammonium ions having two partially double-bonded substituents ($R=N^+H=R$), unsubstituted and substituted pyridinium ions, quaternary ammonium ions having one triple-bonded substituent and one single-bonded substituent ($R\equiv N^+R$), tertiary oxonium ions having one triple-bonded substituent ($R\equiv O^+$), nitrosonium ion ($N\equiv O^+$), tertiary oxonium ions having two partially double-bonded substituents ($R=O^+=R$), pyrylium ion ($C_5H_5O^+$), tertiary sulfonium ions having one triple-bonded substituent ($R\equiv S^+$), tertiary sulfonium ions having two partially double-bonded substituents ($R=S^+=R$), and thionitrosonium ion ($N\equiv S^+$). In some embodiments, the onium ion is selected from unsubstituted and substituted diaryiodonium ions, and unsubstituted and substituted triarylsulfonium ions. Examples of suitable onium salts can be found in U.S. Pat. No. 4,442,197 to Crivello et al., U.S. Pat. No. 4,603,101 to Crivello, and U.S. Pat. No. 4,624,912 to Zweifel et al.

Suitable photoacid generators are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis (p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. Suitable photoacid generators with specific examples are further described in U.S. Pat. No. 8,431,325 to Hashimoto et al. in column 37, lines 11-47 and columns 41-91. In some embodiments, the photoacid generator is non-polymeric.

The photoresist can include a photoinitiator. Photoinitiators are used in the photoresist composition for initiating polymerization of the cross-linking agents by generation of free-radicals. Suitable free radical photoinitiators include, for example, azo compounds, sulfur containing compounds, metallic salts and complexes, oximes, amines, polynuclear compounds, organic carbonyl compounds and mixtures thereof as described in U.S. Pat. No. 4,343,885, column 13, line 26 to column 17, line 18; and 9,10-anthraquinone; 1-chloroanthraquinone; 2-chloroanthraquinone; 2-methylanthraquinone; 2-ethylanthraquinone; 2-tert-butylanthraquinone; octamethylanthraquinone; 1,4-naphthoquinone; 9,10-phenanthrenequinone; 1,2-benzanthraquinone; 2,3-benzanthraquinone; 2-methyl-1,4-naphthoquinone; 2,3-dichloronaphthoquinone; 1,4-dimethylanthraquinone; 2,3-dimethylanthraquinone; 2-phenylanthraquinone; 2,3-diphenylanthraquinone; 3-chloro-2-methylanthraquinone; retenequinone; 7,8,9,10-tetrahydronaphthalenequinone; and 1,2,3,4-tetrahydrobenz(a)anthracene-7,12-dione. Other photoinitiators are described in U.S. Pat. No. 2,760,863 and include vicinal ketaldonyl alcohols, such as benzoin, pivaloin, acyloin ethers, e.g., benzoin methyl and ethyl ethers; and alpha-hydrocarbon-substituted aromatic acyloins, including alpha-methylbenzoin, alpha-allylbenzoin, and alpha-phenylbenzoin. Photoreducible dyes and reducing agents disclosed in U.S. Pat. Nos. 2,850,445; 2,875,047; and 3,097,096 as well as dyes of the phenazine, oxazine, and quinone classes; benzophenone, 2,4,5-triphenylimidazolyl dimers with hydrogen donors, and mixtures thereof as described in U.S. Pat. Nos. 3,427,161; 3,479,185; and 3,549, 367 can be also used as photoinitiators.

The photoresist composition can further include a surfactant. Illustrative surfactants include fluorinated and non-fluorinated surfactants, and are preferably non-ionic. Exemplary fluorinated non-ionic surfactants include perfluoro $C_4$ surfactants such as FC-4430 and FC-4432 surfactants, available from 3M Corporation; and fluorodiols such as POLY-FOX™ PF-636, PF-6320, PF-656, and PF-6520 fluorosurfactants from Omnova.

The photoresist composition can further include quenchers that are non-photo-destroyable bases. These include, for example, those based on hydroxides, carboxylates, amines, imines and amides. Such quenchers include $C_{1-30}$ organic amines, imines or amides, $C_{1-30}$ quaternary ammonium salts of strong bases (e.g., a hydroxide or alkoxide) or a weak base (e.g., a carboxylate). In some embodiments, the photoresist composition further comprises a quencher selected from the group consisting of $C_{1-30}$ amines, $C_{1-30}$ amides, and combinations thereof. Exemplary quenchers include amines such as Troger's base; hindered amines such as diazabicycloundecene (DBU), diazabicyclononene (DBN), and tetrahydroxy isopropyl diamine and tert-butyl-4-hydroxy-1-piperidiene carboxylate; ionic quenchers including quaternary alkyl ammonium salts such as tetrabutylammonium hydroxide (TBAH), tetramethylammonium 2-hydroxybenzoic acid (TMA OHBA), and tetrabutylammonium lactate. Suitable quenchers are further described in U.S. Pat. No. 8,431,325 to Hashimoto et al.

The photoresist components are typically dissolved in a solvent for dispensing and coating. Exemplary solvents include anisole; alcohols including 1-methoxy-2-propanol, and 1-ethoxy-2 propanol; esters including n-butyl acetate, ethyl lactate, 1-methoxy-2-propyl acetate, methoxyethoxy propionate, and ethoxyethoxy propionate; ketones including cyclohexanone and 2-heptanone; and combinations thereof. The solvent amount can be, for example, 70 to 99 weight percent, specifically 85 to 98 weight percent, based on the total weight of the photoresist composition.

The invention further includes a film comprising the photoresist composition. The film can be formed, for example, by spin coating on an unprimed or primed substrate. In some embodiments the film has a thickness of 50 to 200 nanometers. In some embodiments, the film comprises a top surface in contact with air, and at least 50 weight percent of the block copolymer in the film resides within 20 nanometers of the top surface.

The invention further includes a method of forming an electronic device, comprising: (a) applying a layer of any of the photoresist compositions described herein on a substrate; (b) pattern-wise exposing the photoresist composition layer to activating (e.g., ultraviolet or electron beam) radiation; (c) developing the exposed photoresist composition layer to provide a resist relief image. The method can, optionally, further include (d) etching the resist relief pattern into the underlying substrate.

The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, having one or more layers and patterned features formed on a surface thereof. Optionally, the underlying base substrate material itself may be patterned, for example, when it is desired to form trenches in the base substrate material. Layers formed over the base substrate material may include, for example, one or more conductive layers such as layers of aluminum, copper, molybdenum, tantalum, titanium, tungsten, and alloys, nitrides or silicides of such metals, doped amorphous silicon or doped polysilicon, one or more dielectric layers such as layers of silicon oxide, silicon nitride, silicon oxynitride or metal oxides, semiconductor layers, such as single-crystal silicon, underlayers, antireflective layers such as a bottom antireflective layers, and combinations thereof. The layers can be formed by various techniques, for example, chemical vapor deposition (CVD) such as plasma-enhanced CVD, low-pressure CVD or epitaxial growth, physical vapor deposition (PVD) such as sputtering or evaporation, electroplating or spin-coating.

Applying the photoresist composition to the substrate can be accomplished by any suitable method, including spin coating, spray coating, dip coating, and doctor blading. In some embodiments, applying the layer of photoresist composition is accomplished by spin coating the photoresist in solvent using a coating track, in which the photoresist composition is dispensed on a spinning wafer. During dispensing, the wafer can be spun at a speed of up to 4,000 rotations per minute (rpm), specifically 500 to 3,000 rpm, and more specifically 1,000 to 2,500 rpm. The coated wafer is spun to remove solvent, and baked on a hot plate to remove residual solvent and free volume from the film to make it uniformly dense.

Pattern-wise exposure is then carried out using an exposure tool such as a stepper, in which the film is irradiated through a pattern mask and thereby is exposed pattern-wise. In some embodiments, the method uses advanced exposure tools generating activating radiation at wavelengths capable of high resolution including extreme-ultraviolet (EUV) or electron-beam (e-beam) radiation. It will be appreciated that exposure using the activating radiation decomposes the PAG in the exposed areas and generates acid and decomposition by-products, and that the acid then effects a chemical change in the polymer (deblocking the acid sensitive groups to generate a base-soluble group, or alternatively, catalyzing a cross-linking reaction in the exposed areas) during the post exposure bake (PEB) step. The resolution of such exposure tools can be less than 30 nanometers.

Developing the exposed photoresist layer is then accomplished by treating the exposed layer with a suitable developer capable of selectively removing the exposed portions of the film (where the photoresist is positive tone) or removing the unexposed portions of the film (where the photoresist is crosslinkable in the exposed regions, i.e., negative tone). In some embodiments, the photoresist is positive tone based on a polymer having acid-sensitive (deprotectable) groups, and the developer is preferably a metal-ion-free tetraalkylammonium hydroxide solution, such as, for example, aqueous 0.26 Normal tetramethylammonium hydroxide. Alternatively, negative tone development (NTD) can be conducted by use of a suitable organic solvent developer. NTD results in the removal of unexposed regions of the photoresist layer, leaving behind exposed regions due to polarity reversal of those regions. Suitable NTD developers include, for example, ketones, esters, ethers, hydrocarbons, and mixtures thereof. Other suitable solvents include those used in the photoresist composition. In some embodiments, the developer is 2-heptanone or a butyl acetate such as n-butyl acetate. Whether the development is positive tone or negative tone, a pattern forms by developing.

The photoresist composition can, when used in one or more such a pattern-forming processes, be used to fabricate electronic and optoelectronic devices such as memory devices, processor chips (including central processing units or CPUs), graphics chips, and other such devices.

The invention includes at least the following embodiments.

Embodiment 1

A block copolymer comprising: a first block comprising repeat units derived from an out-of-band absorbing monomer that excludes fluorine-substituted ester groups, and a base-solubility-enhancing monomer; and a second block having a surface energy of 15 to 34 millijoules per meter$^2$;

wherein a film cast from the block copolymer has an extinction coefficient, k, of 0.1 to 0.5 at a wavelength in the range of 150 to 400 nanometers.

Embodiment 2

The block copolymer of embodiment 1, having a dispersity ($M_w/M_n$) of 1.05 to 1.2.

Embodiment 3

The block copolymer of embodiment 1 or 2, wherein the out-of-band absorbing monomer is selected from the group consisting of unsubstituted or substituted $C_6$-$C_{18}$ aryl groups provided that substituted $C_6$-$C_{18}$ aryl groups are free of fluorine; unsubstituted or substituted $C_2$-$C_{17}$ heteroaryl groups; $C_5$-$C_{12}$ dienone groups; and combinations thereof.

Embodiment 4

The block copolymer of any one of embodiments 1-3, wherein the out-of-band absorbing monomer has the structure

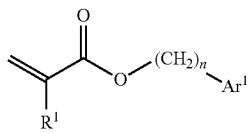

wherein $R^1$ is hydrogen or methyl; n is 0, 1, 2, 3, or 4; and $Ar^1$ is an unsubstituted or substituted $C_6$-$C_{18}$ aryl group, provided that the substituted $C_6$-$C_{18}$ aryl group is free of fluorine.

Embodiment 5

The block copolymer of any one of embodiments 1-4, wherein the base-solubility-enhancing monomer is selected from the group consisting of acid-labile (meth)acrylate esters, base-labile (meth)acrylate esters, (meth)acrylate esters substituted with a group having a $pK_a$ of 2 to 12, and combinations thereof.

Embodiment 6

The block copolymer of any one of embodiments 1-5, wherein the base-solubility-enhancing monomer comprises a tertiary (meth)acrylate ester.

Embodiment 7

The block copolymer of any one of embodiments 1-6, wherein the second block is the product of polymerizing a monomer comprising a polymerizable moiety selected from the group consisting of vinyl, allyl, norbornenyl, (meth) acryloyl, dialcohol, dicarboxylic acid, diester, diisocyanate, combination of isocyanate and alcohol, silyl(dichloro)(hydrocarbyl), diacetylene, glycidyl, and hydroxyphenyl; and; and a low surface energy moiety selected from the group consisting of $C_{10}$-$C_{36}$ alkyl, $C_2$-$C_{12}$ dialkylsiloxane, and $C_1$-$C_{12}$ fluorinated alkyl.

Embodiment 8

The block copolymer of any one of embodiments 1-7, wherein the second block comprises repeat units derived from the (meth)acrylate ester comprising at least one fluorine atom, and wherein the (meth)acrylate ester comprising at least one fluorine atom has the structure

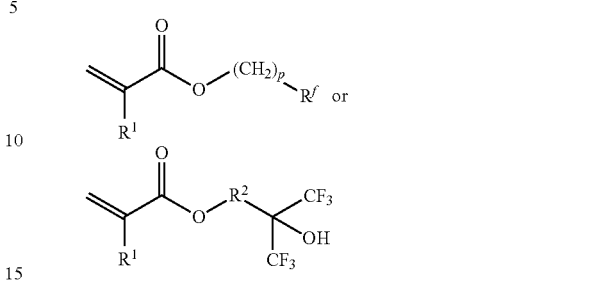

wherein p is 0, 1, 2, 3, or 4; $R^1$ is hydrogen or methyl; $R^2$ is an unsubstituted or substituted $C_1$-$C_{18}$ hydrocarbylene group; and $R^f$ is a $C_1$-$C_{18}$ hydrocarbyl group substituted with at least one fluorine atom and, optionally, further substituted with substituents other than fluorine.

Embodiment 9

The block copolymer of any one of embodiments 1-8, wherein the first block further comprises repeat units derived from a photoacid-generating monomer.

Embodiment 10

A photoresist composition comprising the block copolymer of any one of embodiments 1-9.

Embodiment 11

The photoresist composition of embodiment 10, further comprising a photoacid generator.

Embodiment 12

The photoresist composition of embodiment 10 or 11, further comprising a quencher selected from the group consisting of $C_{1-30}$ amines, $C_{1-30}$ amides, and combinations thereof.

Embodiment 13

A film comprising the photoresist composition of claim 10, wherein the film has a thickness of 50 to 200 nanometers, wherein the film comprises a top surface in contact with air, and wherein at least 50 weight percent of the block copolymer in the film resides within 20 nanometers of the top surface.

Embodiment 14

A method of forming an electronic device, comprising: (a) applying a layer of a photoresist composition of any one of embodiments 10-12 on a substrate; (b) pattern-wise exposing the photoresist composition layer to electron beam or extreme ultraviolet radiation; and (c) developing the exposed photoresist composition layer to provide a resist relief image.

EXAMPLES

Table 1 provides chemical structures and acronyms for low surface energy (meth)acrylate monomers used in these examples to form the second block of the block copolymer.

TABLE 1

| Category | Monomers |
|---|---|
| Fluorinated | 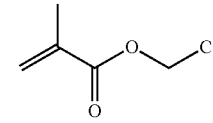 TFEMA |
| | 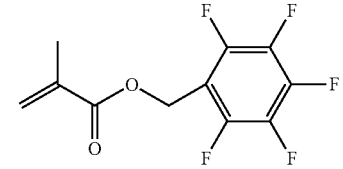 PFBzMA |
| | 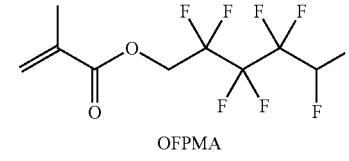 OFPMA |
| | 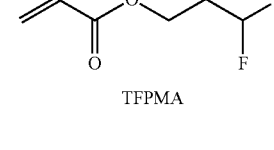 TFPMA |
| | 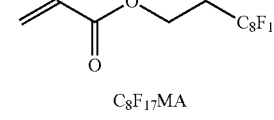 C$_8$F$_{17}$MA |
| Hydroxyfluorinated | 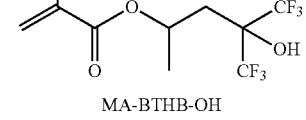 MA-BTHB-OH |
| | 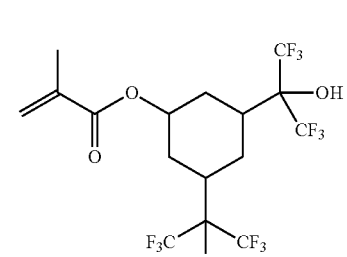 MA-3,5-HFA-CHOH |
| | 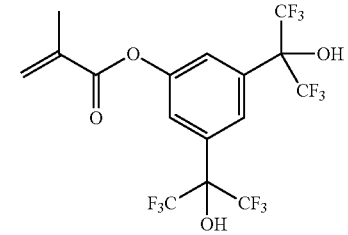 MA-3,5-HFA-PHOH |
| | 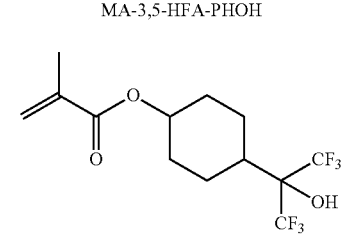 MA-4-HFA-CHOH |
| | 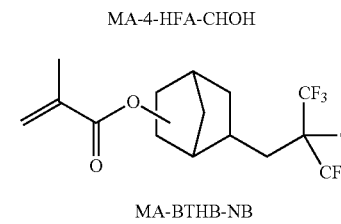 MA-BTHB-NB |
| Aliphatic | 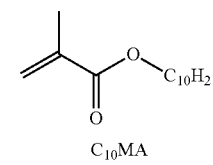 C$_{10}$MA |
| | 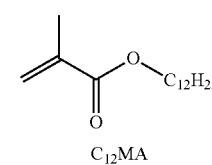 C$_{12}$MA |
| | 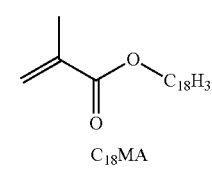 C$_{18}$MA |
| Silicon | 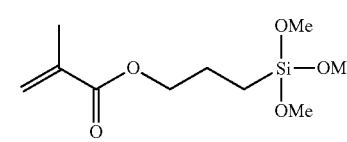 TMSPMA |

Abbreviations: TFEMA, trifluoroethyl methacrylate; TFPMA, tetrafluoropropyl methacrylate; PFBzMA, pentafluorobenzyl methacrylate; C$_8$F$_{17}$MA, Heptadecafluoro-1-nonyl methacrylate; OFPMA, octafluoropentyl methacrylate; MA-BTHB-OH, 4-trifluoromethyl-4-hydroxy-5,5,5-trifluoro-2-pentyl methacrylate; MA-BTHB-NB, 2-methyl-acrylic acid 5-(3,3,3-trifluoro-2-hydroxy-2-trifluormethyl-propyl)-bicyclo[2.2.1]hept-2-yl ester; MA-4-HFA-CHOH, 2-Propenoic acid, 2-methyl-4-[2,2,2-trifluoro-1-hydroxy-1-(trifluoromethyl)ethyl]cyclohexyl ester; MA-3,5-HFA-CHOH, 2-Propenoic acid, 2-methyl-3,5-bis[2,2,2-trifluoro-1-hydroxy-1-(trifluoromethyl)ethyl]cyclohexyl ester; MA-3,5-HFA-PHOH, 2-Propenoic acid, 2-methyl-3,5-bis[2,2,2-trifluoro-1-hydroxy-1-(trifluoromethyl)ethyl] phenyl ester; C$_{10}$MA, decyl methacrylate; C$_{12}$MA, dodecyl methacrylate; C$_{18}$MA, stearyl methacrylate; TMSPMA, trimethoxysilylpropyl methacrylate.

Table 2 provides chemical structures and acronyms for base-solubility-enhancing monomers used in these examples.

TABLE 2

Monomers

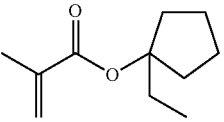

ECPMA

GBLMA

TBMA

EAdMA

Abbreviations: ECPMA, 1-ethyl-1-cyclopentyl methacrylate; GPLMA, gamma-butyrolactone methacrylate; TBMA, t-butyl methacrylate; EAdMA, 2-ethyl-2-adamantyl methacrylate.

Table 3 provides chemical structures and acronyms for out-of-band absorbing monomers used in these examples.

TABLE 3

Monomers

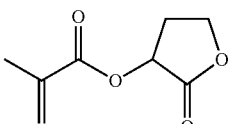

BzMA

HNMA

Abbreviations: BzMA, benzyl methacrylate; HNMA, (5-hydroxy-1-napthalenyl)methyl methacrylate.

Table 4 provides chemical structures and acronyms for the photoacid generating (PAG) monomer and photoresist polymer used in these examples.

TABLE 4

Compounds

PAG Monomer

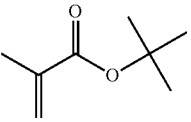

TPS DFES

Photoresist Polymer

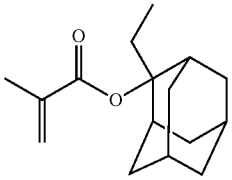

CBP-4

Abbreviations: TPS DFES, triphenylsulfonium 2,2-difluoro-2-sulfonatoethyl methacrylate Synthesis of Poly(ECPMA-Co-BzMA) Statistical Copolymer by the RAFT Technique.

A reaction scheme for the RAFT synthesis of poly (ECPMA-co-BzMA) is presented in FIG. 1. 1-Ethylcyclopentyl methacrylate (ECPMA, 1.597825 g, 0.008864 mole), benzyl methacrylate (BzMA, 1.561925 g, 1.507851 ml, 0.008864 mole), 4-cyano-4-[(dodecylsufanylthiocarbonyl) sulfanyl]pentanoic acid (CDTPA, RAFT agent, 39.3 mg (91% pure), $0.89 \times 10^{-4}$ mole), azoisobutyronitrile (AIBN, initiator, 1.5 mg, $9 \times 10^{-6}$ mole) and THF (10 mL) were introduced in a 50 mL Schlenk flask equipped with a magnetic stirrer ($[M]_0:[mCTA]_0:[Init]_0=200:1:0.1$). The reaction mixture was purged with argon for 30 minutes in an ice bath to remove oxygen, and then heated at 65° C. The monomer conversion was calculated by $^1$H NMR and the polymer was recovered by double precipitation in hexane. The polymer was characterized by proton nuclear magnetic resonance spectroscopy ($^1$H NMR), ultraviolet-visible spectroscopy (UV-VIS) and size exclusion chromatography (SEC) using polystyrene standards. SEC indicated a number average molecular weight ($M_n$) of 9,500 and a dispersity ($M_w/M_n$) of 1.09.

Chain-End Modification Via One-Pot Aminolysis and Michael-Addition Reaction.

Figure 2:
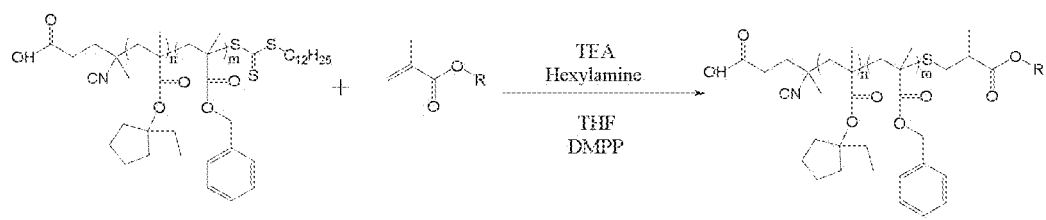
FIG. 2 is a reaction scheme for the chain-end modification (end group removal) of RAFT-synthesized poly(ECPMA-co-BzMA).

A reaction scheme for the chain-end modification of a RAFT polymer is presented in FIG. 2. The chain-end modification was carried out as follows. Poly(ECPMA-co-BzMA) (0.6 g, $5 \times 10^{-5}$ mole), trifluoroethyl methacrylate (168.1 milligrams, 20 equivalents) and dimethylphenylphosphine (DMPP; 20.7 milligrams, 3 equivalents) were dissolved in tetrahydrofuran (THF, 10 milliliters). The solution was placed in an ice bath and purged with argon for 25 minutes. A solution of hexylamine (50.6 milligrams, 10 equivalents), triethylamine (TEA, 50.6 microliters, 10 equivalents) and THF (5 milliliters) was also purged under argon (15 minutes) and then added to the previous solution under argon. The solution was stirred at room temperature for 24 hours. The product was dried under nitrogen flow, solubilized in acetone, purified by consecutive precipitations in hexane (twice), and dried under vacuum.

RAFT Chain Extension of Poly(ECPMA-Co-BzMA) with Methacrylate Monomer.

Figure 3:
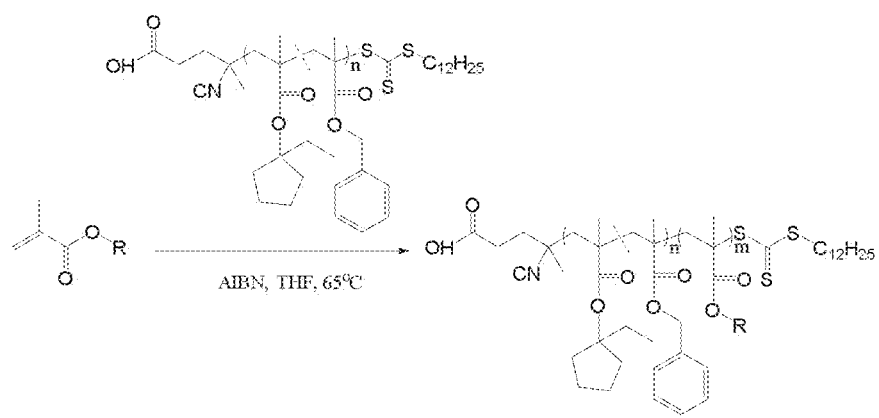
FIG. 3 is a reaction scheme for the RAFT chain extension of poly(ECPMA-co-BzMA) with a methacrylate monomer.
Figure 4:
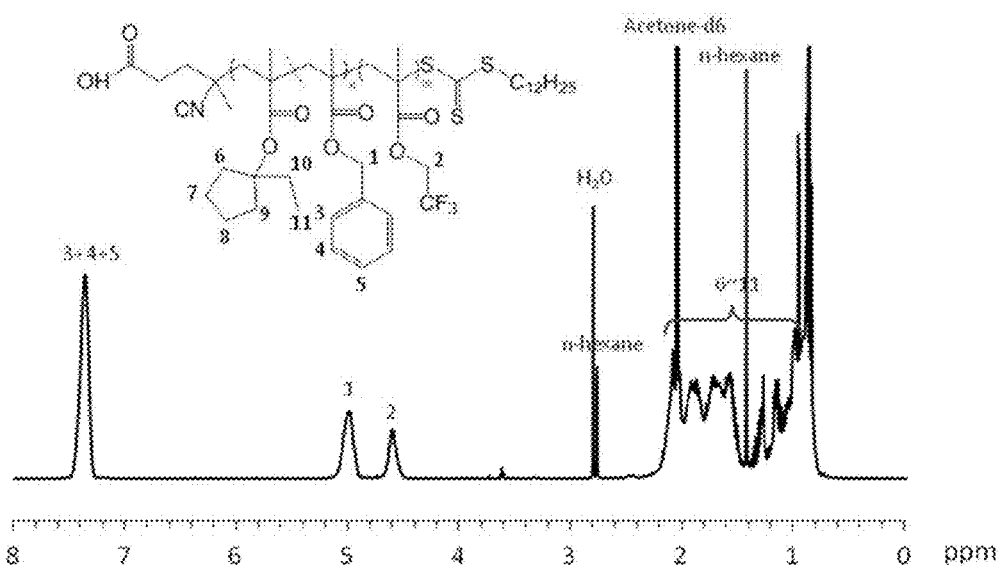
FIG. 4 is a proton nuclear magnetic resonance ($^1$H NMR) spectrum of RAFT-synthesized poly[(ECPMA-co-BzMA)-b-TFEMA].

A reaction scheme for the RAFT chain extension of Poly(ECPMA-co-BzMA) with methacrylate monomer is presented in FIG. 3. RAFT polymerization of a methacrylate monomer in the presence of a Poly(ECPMA-co-BzMA) as the macro chain transfer agent (macroCTA) was carried out as follows. Trifluoroethyl methacrylate (TFEMA, 0.2 gram, 0.000297 mole), macroCTA (0.4759 gram, $4.0 \times 10^{-5}$ mole), AIBN (1.3 milligrams, $8 \times 10^{-6}$ mole) and THF (5 milliliters) were introduced in a 10 milliliter Schlenk flask equipped with a magnetic stirrer ($[M]_0:[mCTA]_0:[Init]_0=30:1:0.2$). The reaction mixture was purged with argon for 20 minutes in an ice bath to remove oxygen, and then heated at 65° C. After 20 hours, the monomer conversion was calculated by $^1$H NMR and the polymer was recovered by double precipitation in hexane. The polymer was characterized by $^1$H NMR, UV-VIS, and SEC. A $^1$H NMR spectrum is presented as FIG. 4. SEC indicated a number average molecular weight of 13,000 and a dispersity of 1.15.

End Group Removal of RAFT Polymer.

Figure 5:
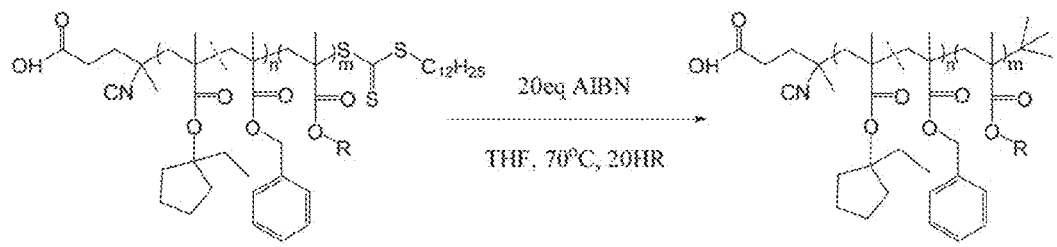
FIG. 5 is a reaction scheme for RAFT end group removal from poly[(ECPMA-co-BzMA)-b-TFEMA].
Figure 6:
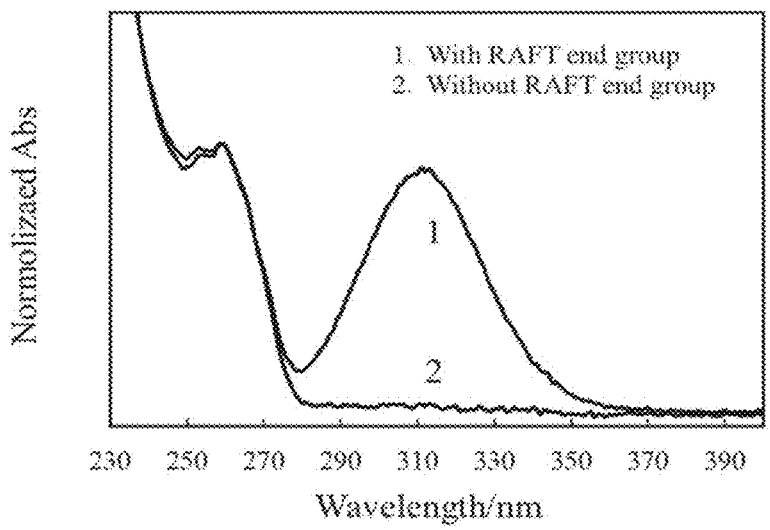
FIG. 6 is an ultraviolet-visible (UV-VIS) spectrum of poly[(ECPMA-co-BzMA)-b-TFEMA] before and after RAFT end group removal.

A reaction scheme for end group removal from the chain-extended RAFT polymer is presented in FIG. 5. The end-group cleavage of the chain-extended RAFT polymer was carried out as follows. Poly[(ECPMA-co-BzMA)-b-TFEMA] (0.6 gram, $4 \times 10^{-5}$ mole), AIBN (131.3 milligrams, $8 \times 10^{-4}$ mole, 20 equivalents) and THF (15 milliliters) were introduced in a 30 mL Schlenk flask equipped with a magnetic stirrer. The reaction mixture was purged with argon for 20 minutes in an ice bath to remove oxygen, and then heated at 70° C. After 20 hours, the polymer was recovered by double precipitation in hexane. The polymer was characterized by $^1$H NMR, UV-VIS, and SEC. UV-VIS spectra of the copolymer before and after end group removal are presented as FIG. 6.

Blending of Photoresist Polymer (CBP-4) with Low Surface Energy Polymer and Quencher.

A photoresist solution was prepared as follows. Photoresist polymer CBP-4 (36 mg), end group cleaved poly (ECPMA-co-BzMA-b-TFEMA) (4 milligrams), and triisopropanolamine (0.22 milligrams, 20 mole percent relative to 100 moles PAG) were introduced in a 20 milliliter vial. Propylene glycol monomethyl ether acetate (PGMEA; 785 microliters, 760 milligrams) was added to make a solution with a total concentration of CBP-4 polymer plus additive polymer of 5 weight percent. The content of low surface energy polymer additive was 10 weight percent of the total weight of the polymer.

Spin Coating Process.

A representative spin coating process was carried out as follows. First, the silicon wafer was rinsed with acetone and isopropanol. Then the silicon wafer was placed on a 100° C. hotplate for 10 minutes. Then the silicon wafer was further cleaned by $O_2$ plasma treatment. An adhesion promoter obtained as TI/HDMS prime from MicroChemicals was spin coated on the clean silicon wafer at a speed of 3000 rotations per minute (rpm) for 20 seconds, followed by baking on a 120° C. hotplate for 2 minutes to remove the solvent. The solution containing photoresist, low surface energy polymer, and quencher was spin coated on the primer layer at a speed of 3000 rpm for 60 seconds. Following coating of the photoresist solution onto the wafer, it was dried by heating at 100° C. for 90 s to remove the solvent until the photoresist coating was tack free.

Exposure.

The photoresist with low surface energy polymer composition layer was then patterned exposed to activating radiation with the exposure energy typically ranging from about 10 to about 100 microCoulombs/centimeter$^2$ ($\mu C/cm^2$), depending on the exposure tool and the components of the film composition. Typically, the electron beam lithography technique was utilized as an exposure tool to generate patterns.

Post-Exposure Bake and Development.

Following exposure, the photoresist with low surface energy polymer composition layer was baked at a temperature ranging from about 100° C. to 120° C. for 60 to 120 seconds. Thereafter, the photoresist was developed by treatment with an aqueous alkaline developer such as 0.26 N tetramethylammonium hydroxide for 30 to 60 seconds, followed by a water rinse for 30 to 60 seconds.

Measurement of Contact Angles and Calculation of Surface Free Energy.

The segregation of the low surface energy polymers (LSEPs) from CBP-4 matrix can be reflected by the surface free energy change, which can be obtained through the measurement of the static contact angle on the surface. A typical procedure for preparing samples for contact angle measurement was as follows. Solution of the sample was spin coated on the clean Si wafer using a procedure similar to that described above, except that no adhesion promoter was applied on the wafer prior to the photoresist layer. A typical solution of the sample comprised CBP-4 photoresist (36 mg), end group cleaved poly[(ECPMA-co-BzMA)-b-TFEMA] (4 mg) and PGMEA as solvent (760 mg), in which the content of low surface energy polymer is 10 weight percent of the total weight of polymer. Contact angles were measured using a Dataphysics OCA20 contact-angle system at room temperature. Deionized water or diiodomethane droplets (0.5 mL) were dropped onto sample surfaces in order to conduct measurements of the wetting behavior. The surface energy was calculated according to Fowkes method, the surface free energy $\gamma_s$ of each sample was calculated as follows.

$$\gamma_s^d = 0.25 \gamma_l (1+\cos \theta_d)^2 \quad \text{Equation 1}$$

$$\gamma_s^p = \{0.5\gamma_l(1+\cos \theta_p)-(\gamma_s^d \gamma_l^d)^{0.5}\}^2/\gamma_l^p \quad \text{Equation 2}$$

$$\gamma_s = \gamma_s^d + \gamma_s^p \quad \text{Equation 3}$$

Wherein water and diiodomethane were used as the measuring liquids: water is considered as the liquid with the dominant polar component ($\gamma_l^d=21.8$ mJ/m$^2$ and $\gamma_l^p=51.0$ mJ/m$^2$) and diiodomethane, as the dispersion liquid ($\gamma_l=\gamma_l^d=50.8$ mJ/m$^2$, $\gamma_l=\gamma_l^d+\gamma_l^p$). $\theta_d$ was the contact angle of diiodomethane on the sample surface and $\theta_p$ was water contact angle on the sample surface. According to the experimental data $\theta_d$ and $\theta_p$, the surface free energies of CBP-4 with different LSEPs were calculated and summarized in Table 5. It is noted that the surface free energy decreased in all the cases of CBP-4/LSEP surfaces compared with plain CBP-4 surface.

TABLE 5

Contact angle and surface free energy of CBP-4 blending with different LSEPs

| Samples | | Contact angle (°) | | Surface free energy (mN/m) | | |
|---|---|---|---|---|---|---|
| | | $H_2O$ | $CH_2I_2$ | $\gamma sd$ | $\gamma sp$ | $\gamma s$ |
| CBP-4 | | 81.0 ± 3.4 | 51.6 ± 4.4 | 33.4 | 4.5 | 37.9 |
| CPB-4 + Poly(ECPMA-co-BzMA)-TFEMA | 2% | 86.0 ± 3.5 | 58.4 ± 3.8 | 29.5 | 3.6 | 33.1 |
| | 5% | 89.2 ± 3.9 | 61.3 ± 1.3 | 27.8 | 3.0 | 30.8 |
| | 10% | 90.2 ± 0.6 | 62.9 ± 3.8 | 26.9 | 2.8 | 29.7 |
| Poly(ECPMA-co-BzMA)-TFEMA | | 95.7 ± 0.7 | 67.1 ± 3.4 | 24.5 | 1.8 | 26.3 |
| CPB-4 + Poly(ECPMA-co-BzMA)-4-HFA-CHOH | 2% | 86.3 ± 2.4 | 58.4 ± 2.8 | 29.5 | 3.5 | 33.0 |
| | 5% | 87.6 ± 1.8 | 59.6 ± 1.0 | 28.8 | 3.2 | 32.0 |
| | 10% | 88.0 ± 1.4 | 59.0 ± 2.0 | 29.1 | 3.0 | 32.1 |
| Poly(ECPMA-co-BzMA)-4-HFA-CHOH | | 88.1 ± 2.8 | 60.0 ± 2.2 | 28.6 | 3.1 | 31.7 |
| CBP-4 + Poly(ECPMA-co-BzMA)-b-(TFEMA) | 2% | 89.1 ± 1.8 | 65.1 ± 3.8 | 25.6 | 3.5 | 29.1 |
| | 5% | 93.4 ± 1.6 | 67.6 ± 3.3 | 24.2 | 2.5 | 26.7 |
| | 10% | 98.9 ± 1.0 | 75.6 ± 2.8 | 19.8 | 2.0 | 21.8 |
| Poly(ECPMA-co-BzMA)-b-(TFEMA) | | 100.7 ± 0.8 | 82.5 ± 3.3 | 16.2 | 2.4 | 18.6 |
| CBP-4 + Poly(ECPMA-co-BzMA)-b-(4-HFA-CHOH) | 2% | 86.6 ± 2.0 | 59.2 ± 2.0 | 29.0 | 3.5 | 32.5 |
| | 5% | 85.4 ± 1.5 | 59.5 ± 1.6 | 29.0 | 3.9 | 32.9 |
| | 10% | 86.9 ± 1.7 | 59.8 ± 1.2 | 28.7 | 3.5 | 32.2 |
| Poly(ECPMA-co-BzMA)-b-(4-HFA-CHOH) | | 85.9 ± 1.0 | 61.2 ± 2.3 | 27.9 | 4.0 | 31.9 |

Surface Composition Analysis.

The TOF-SIMS characterization was also carried out in this invention in order to prove the segregation of LSEPs from CBP-4 matrix. The preparation of samples for TOF-SIMS characterization was as described earlier in the specification. The objective of TOF-SIMs characterization was to determine whether the LSEP additives could segregate from the photoresist matrix and diffuse to the interface. TOF-SIMS has been selected due to its high surface specificity (2 nm) and ability to provide structural information. TOF-SIMS measurements were performed with a PHI TRIFT V nanoTOF instrument (PHI Electronics Ltd, USA). A 30 keV, pulsed primary[197] Au+ ion beam was used to sputter and ionize species from each sample surface. PHI's patented dual beam charge neutralization system using a combination of low energy argon ions (up to 10 eV) and electrons (up to 25 eV) was employed to provide an excellent charge neutralization performance. Positive mass axis calibration was done with $CH_3^+$, $C_2H_5^+$ and $C_3H_7^+$ whilst $CH^-$, $C_2H^-$ and $F^-$ were used to calibrate negative mass axis. Spectra were acquired in the bunched mode for 60 seconds from an area of 100 μm×100 μm. The corresponding total primary ion dose was less than $1\times10^{12}$ ions $cm^{-2}$, and thus met the static SIMS regime. A mass resolution m/Δm of >7000 at nominal m/z=27 Daltons ($C_2H_3^+$) was typically achieved.

Each sample was characterized by five positive and five negative mass spectra, which were collected from sample areas that did not overlap. 146 positive and 68 negative fragments were used in calculations including some unique molecular ions. The peaks were normalized to the sum of the selected intensities in positive and negative modes independently. Multiple mass spectra were processed with the aid of principal component analysis, PCA. PCA was performed using PLS Toolbox version 3.0 (Eigenvector Research, Inc., Manson, Wash.) along with MATLAB software v. 6.5 (MathWorks Inc., Natick, Mass.). Selected normalized intensities were also subjected to Analysis of Means.

Figure 7A:
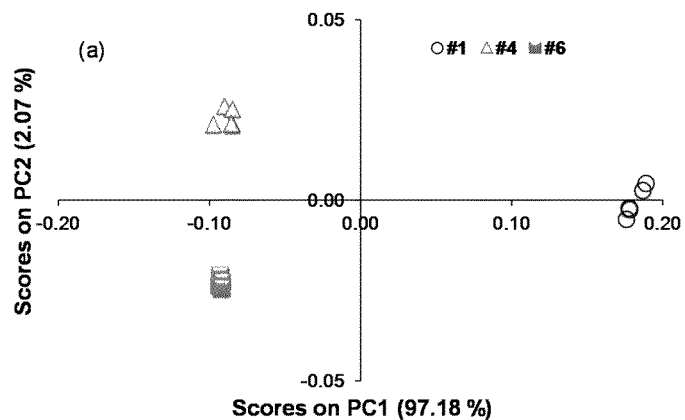
FIGS. 7A, 7B, and 7C present time of flight secondary ion mass spectrometry (TOF-SIMS) results for blended photoresist films.
Figure 7B:
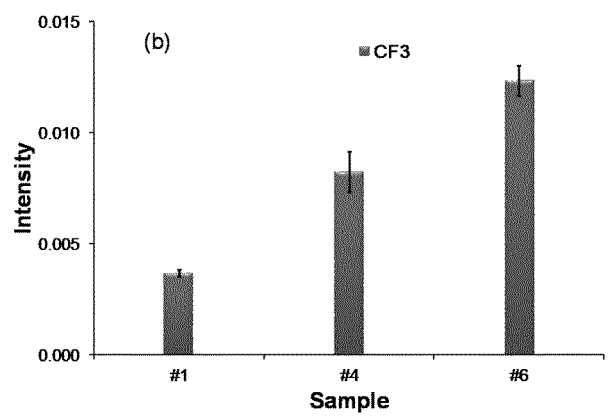
Figure 7C:
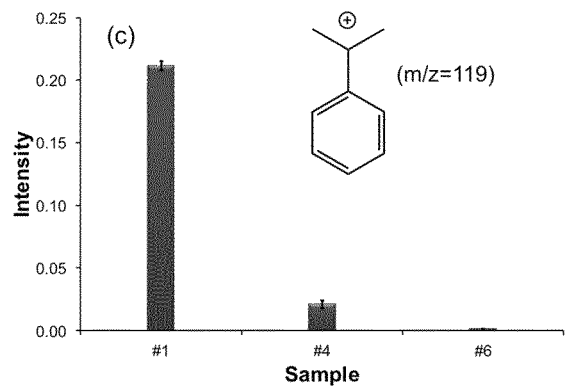

FIG. 7(a) shows scores plot of positive mass spectra on principal component 1 (PC1) and principal component 2 (PC2) for CBP-4 (#1), CBP-4+10% poly[(ECPMA$_{32}$-co-BzMA$_{34}$)-b-(MA-4-HFA-CHOH)$_{26}$] (#4) and poly[(ECPMA$_{32}$-co-BzMA$_{34}$)-b-(MA-4-HFA-CHOH)$_{26}$] (#6). The overall surface chemistry of the blend containing 10 wt % of poly[(ECPMA$_{32}$-co-BzMA$_{34}$)-b-(MA-4-HFA-CHOH)$_{26}$] is very similar to that of the pure additive, #6. Most of the CBP-4 photoresist surface "moieties" appear to be hidden behind a thin film of LSEP #6, though there is a degree of transparency even when measured by TOF-SIMS. The intensity of the $CF_3^+$ fragment, presented in FIG. 7(b), follows the order: #1<#4<#6. FIG. 7(c) shows statistically-evaluated intensities of $C_9H_{11}^+$ (structural marker of CBP-4) #1, #4 and #6. It also shows that the surface composition of surface #4 resembles the structure of surface #6. These results indicate that the LSEP polymer Poly[(ECPMA-co-BzMA)-b-(MA-4-HFA-CHOH)] does segregate from the CBP-4 matrix and phase separation successfully.

Measurement of the Optical Properties.

In order to examine the blocking effect to the out-of-band light in the presence of LSEP additive, the optical properties of the thin films were measured by VUV VASE ellipsometer. The preparation of samples for VUV VASE ellipsometer characterization was the same as described in earlier sections ("Blending of photoresist polymer (CBP-4) with low surface energy polymer and quencher") and ("Spin coating process"). Optical constants, n and k, and film thicknesses were measured on a J.A. Woollam™ VUV VASE™ Spectroscopic Ellipsometer. The VUV-VASE measurements were performed using a spectral range from 1.2 to 8.3 eV (referring to wavelength range λ 150-1000 nm), and angles of incidence of 65° C.-75° C., by 5° C. as a step, to maximize the accuracy. The entire optical path was enclosed inside a dry nitrogen purge to eliminate absorption from ambient water vapor and oxygen. The modeling and fitting procedure in this study consisted of first determining the thickness and optical constants of transparent region of spectra from 300 nm to 1000 nm using a Cauchy layer and then using a point-by-point method to fit the curve ranging from 150 nm to 300 nm in order to obtain the optical constants extinction coefficient 'k' and refractive index 'n'.

Figure 8:
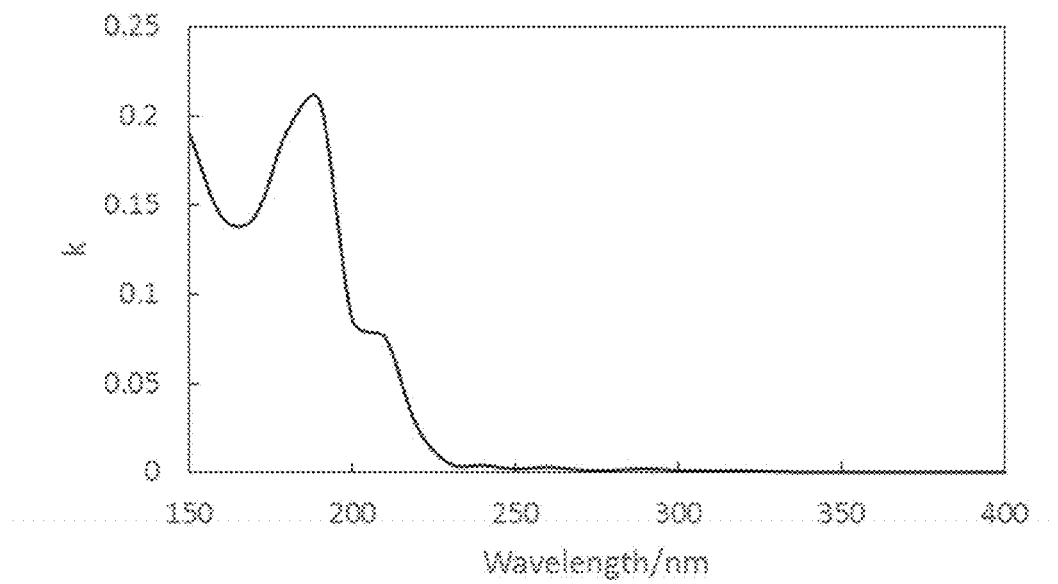
FIG. 8 is a plot of extinction coefficient versus wavelength for a 102 nanometer thick film of the low surface energy polymer (LSEP) poly(ECPMA$_{32}$-co-BzMA$_{34}$-b-HFA-CHOH$_{26}$).
Figure 9:
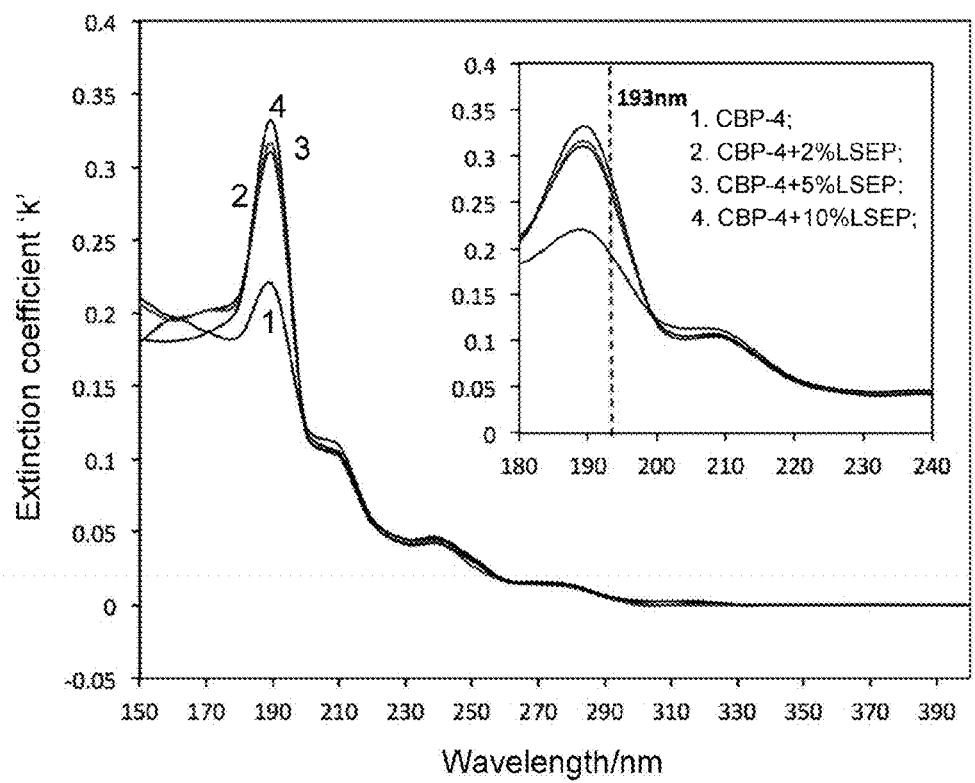
FIG. 9 is a plot of extinction coefficient versus wavelength for photoresist coatings containing zero, 2, 5, and 10 weight percent of block copolymer.

Once the extinction coefficient k has been determined, the optical absorption parameters absorbance (A) and absorption coefficient (α) can be determined using Equation 4-6.

$$\alpha = 4\pi k/\lambda \quad \text{Equation 4}$$

$$T = I_T/I_0 = e^{-\alpha cl} \quad \text{Equation 5}$$

$$A = \log_{10} I_0/I_T \quad \text{Equation 6}$$

Where T is the transmittance, α is an extinction constant, c is concentration and l is light path length. According to this calculating method, the extinction coefficients as a function of wavelength for the LSEP are plotted in FIG. 8. Furthermore, the optical properties of CBP-4 with 0%, 2%, 5%, and 10% of the low surface energy polymer (LSEP) Poly[(ECPMA-co-BzMA)-b-(MA-4-HFA-CHOH)] were tabulated in Table 6. Extinction coefficients as a function of wavelength are plotted in FIG. 9.

TABLE 6

Optical properties of CBP-4 with 0%, 2%, 5%, and 10% of the low surface energy polymer (LSEP) Poly(ECPMA-co-BzMA-b-HFACHOH)

| Sample | Film thickness/ nm | k value @193 nm | T % @193 nm | Absorbance @193 nm | Absorption coefficient α/μm−1 | a/d Absorbance/ micron |
|---|---|---|---|---|---|---|
| CBP-4 | 82.65 ± 0.04 | 0.1975 | 29.5 | 0.5415 | 12.9 | 5.59 |
| CBP-4 + 2% LSEP | 81.88 ± 0.01 | 0.2680 | 19.0 | 0.7348 | 17.4 | 7.58 |
| CBP-4 + 5% LSEP | 82.58 ± 0.12 | 0.2705 | 18.7 | 0.7416 | 17.6 | 7.66 |
| CBP-4 + 10% LSEP | 85.57 ± 0.02 | 0.2870 | 16.9 | 0.7869 | 18.7 | 8.12 |

Measurement of Dissolution of the Photoresist and LSEP Layers.

Figure 10:
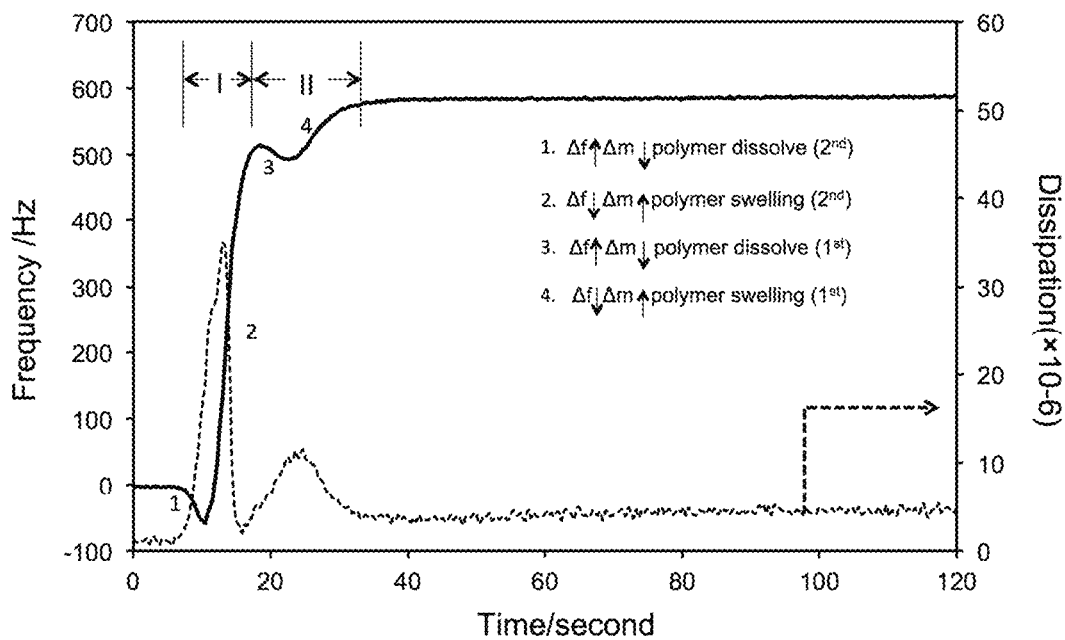
FIG. 10 is a plot of Quartz Crystal Microbalance (QCM) frequency change and dissipation change as a function of time for a photoresist layer during alkaline development.

Quartz Crystal Microbalance with Dissipation monitoring (QCM-D, Q-Sense) was used to monitor the dissolution of photoresist and LSEP layer in real-time. The thin film dissolution during development process was studied based on resonance frequency and dissipation change. It was found that two swelling layers (in region I and II, FIG. 10) were formed during the dissolution process. The thin film showed a complicated swelling behavior during development owing to the dissolution difference of the LSEP and photoresist layer.

The preparation of the sample solution used for QCM-D characterization was introduced earlier in the specification. Q-Sense silicon oxide or gold sensors were firstly cleaned by rinsing in acetone and isopropanol followed by dried at 100° C. hotplate for 10 minutes. Once clean, it was spin-coated with the polymer solution to 80~90 nm thickness. The polymer-coated sensors were then placed on 100° C. hotplate for 90 seconds to remove the residual solvent. After that, they were subjected to UV light for 5~10 min and again placed on 100° C. hotplate for 60 seconds to generate a photo acid catalyzed deprotection reaction. Finally, the polymer-coated quartz crystals were developed in a flow module designed to flow liquid over the crystal while measuring the resonance frequency of the crystal. In this invention, the flow liquid was 0.26 N tetramethylammonium hydroxide (TMAH) solution and the flow rate was chosen as 200 μL/min. It should be noted that the method proved a useful tool to understand the complicated development process but was not ideal for giving absolute development rate values.

Synthesis of PAG-Bound LSEP.

Figure 11:
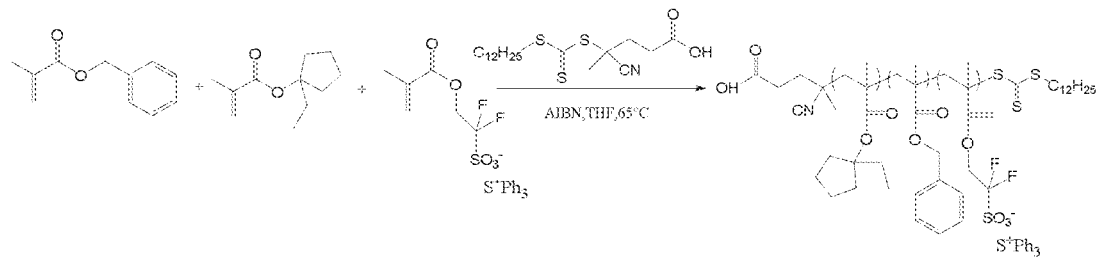
FIG. 11 is reaction scheme for the RAFT synthesis of poly(ECPMA-co-BzMA-co-(TPS DFES)).

A reaction scheme for the RAFT synthesis of poly (ECPMA-co-BzMA-co-(TPS DFES)) random copolymer is presented in FIG. 11. 1-Ethylcyclopentyl methacrylate (0.18026 g, 0.001 mole) and benzyl methacrylate (0.17621 gram, 0.001 mole), TPS DFES (0.109458 gram, 2.22×10$^{-4}$ mole), CDTPA (9.86 milligrams (91% pure), 0.89×10$^{-4}$ mole), AIBN (0.4 milligram, 2×10$^{-6}$ mole) and THF (3 milliliters) were introduced in a 10 mL Schlenk flask equipped with a magnetic stirrer ([M]$_0$:[mCTA]$_0$:[Init]$_0$=100:1:0.1). The reaction mixture was purged with argon for 30 minutes in an ice bath to remove oxygen, and then heated at 65° C. The monomer conversion was calculated by $^1$H NMR and the polymer was recovered by double precipitation in hexane. The polymer was characterized by $^1$H NMR, UV-VIS, and SEC.

RAFT Chain Extension of Poly(ECPMA-Co-BzMA-Co-(TPS DFES)) with Low Surface Energy Methacrylate.

Figure 12:
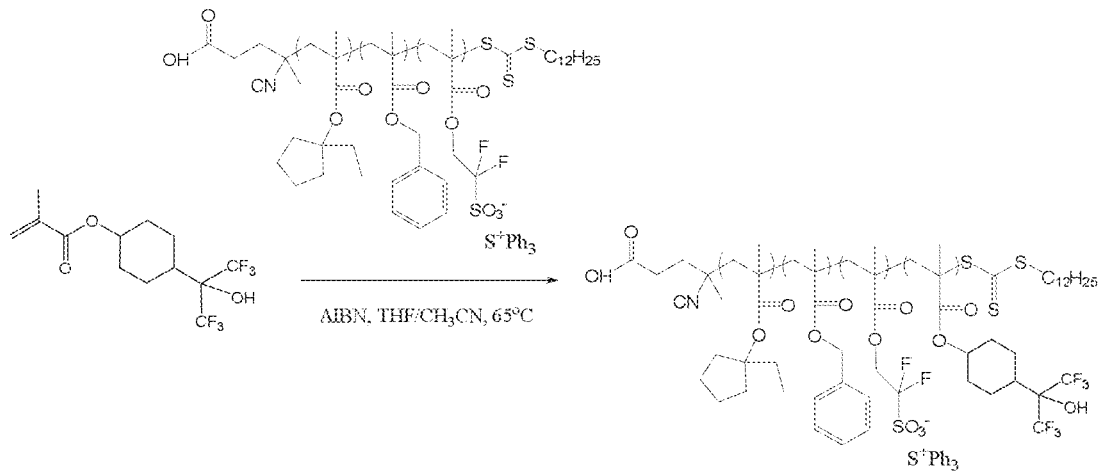
FIG. 12 is a reaction scheme for RAFT chain extension of poly(ECPMA-co-BzMA-co-(TPS DFES)).

A reaction scheme for RAFT chain extension of poly (ECPMA-co-BzMA-co-(TPS DFES)) is presented in FIG. 12. A representative RAFT polymerization of a chain extension reaction with fluorinated methacrylate monomer in the presence of a poly(ECPMA-co-BzMA-co-(TPS DFES)) as the mCTA was carried out as follows. MA-4-HFA-CHOH (0.2 gram, 0.000598 mole), macroCTA (0.3451 gram, 2.0× 10$^{-5}$ mole), AIBN (0.7 milligram, 4×10$^{-6}$ mole) and THF (3.5 milliliters) were introduced in a 10 mL Schlenk flask equipped with a magnetic stirrer ([M]$_0$:[mCTA]$_0$:[Init]$_0$=30: 1:0.2). The reaction mixture was purged with argon for 20 minutes in an ice bath to remove oxygen, and then heated at 65° C. After 20 hours, the monomer conversion was calculated by $^1$H NMR and the polymer was recovered by double precipitation in hexane. The polymer was characterized by $^1$H NMR, UV-VIS, and SEC.

End Group Removal of RAFT Polymer.

Figure 13:
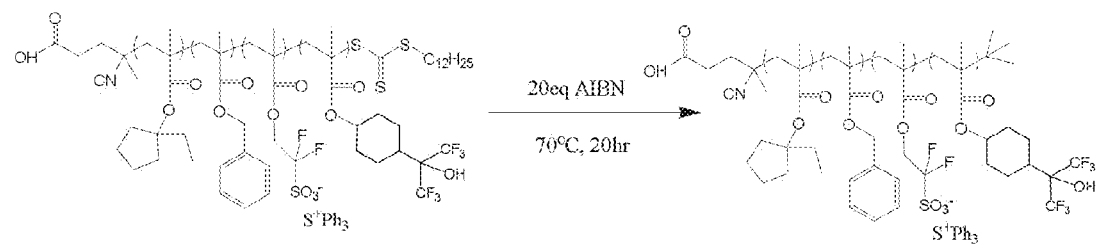
FIG. 13 reaction scheme for end group removal from RAFT-synthesized poly[(ECPMA-co-BzMA-co-(TPS DFES))-b-(MA-4-HFA-CHOH)].
Figure 14:
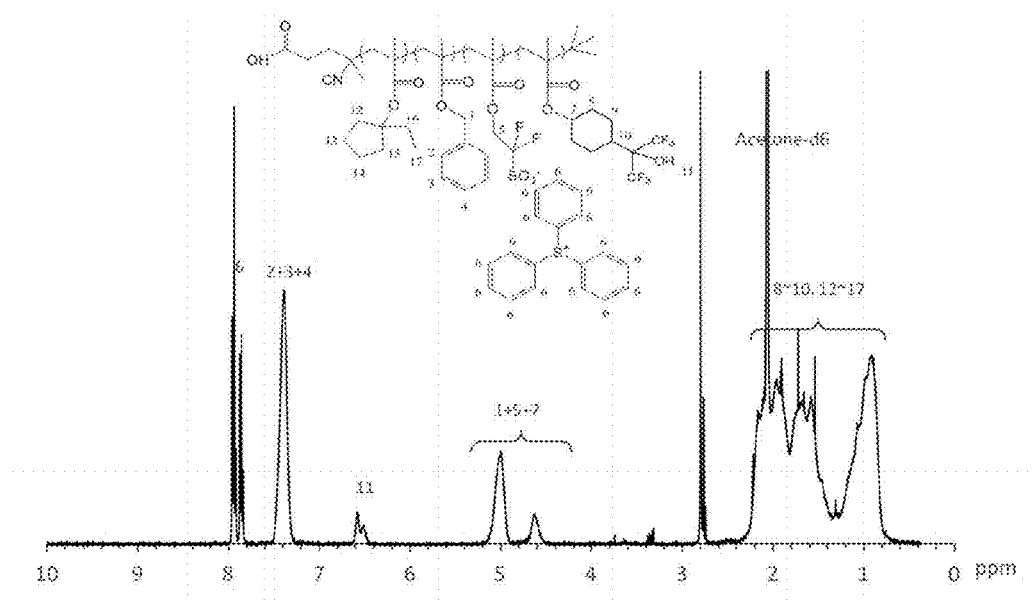
FIG. 14 is a $^1$H NMR spectrum of poly[(ECPMA-co-BzMA-co-(TPS DFES))-b-(MA-4-HFA-CHOH)] after RAFT end group removal.
Figure 15:
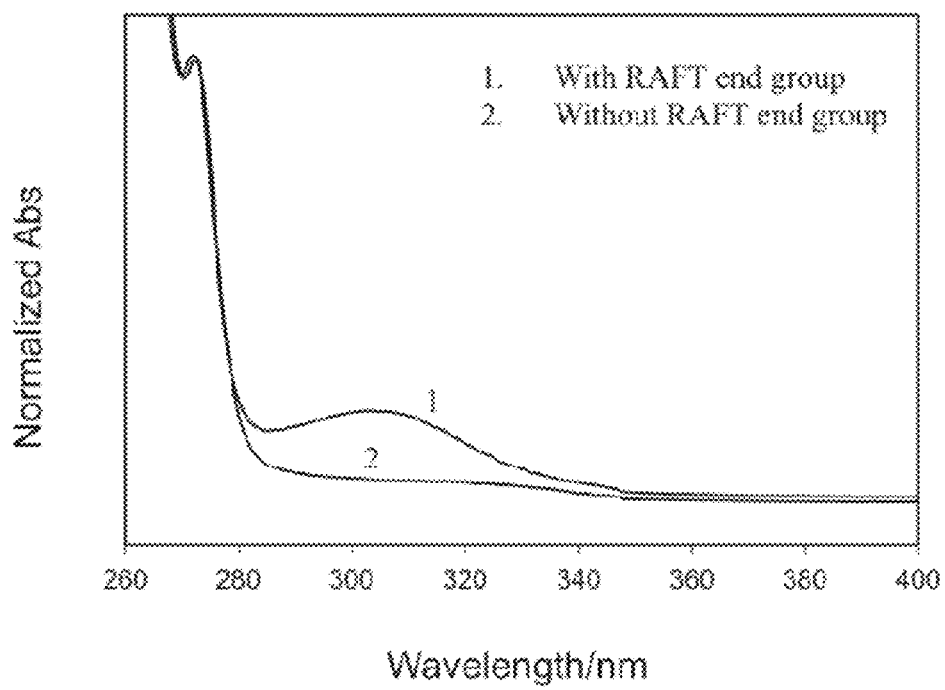
FIG. 15 presents normalized UV-vis spectra for poly [(ECPMA-co-BzMA-co-(TPS DFES))-b-(MA-4-HFA-CHOH)] before and after RAFT end group removal.

A reaction scheme for end group removal from RAFT-synthesized poly[(ECPMA-co-BzMA-co-(TPS DFES))-b-(MA-4-HFA-CHOH)] is presented in FIG. 13. A representative end group cleavage process of a RAFT polymer was carried out as follows. Poly[(ECPMA-co-BzMA-co-(TPS DFES))-b-(MA-4-HFA-CHOH)] (0.2 gram, 8×10$^{-6}$ mole), AIBN (26 milligrams, 1.6×10$^5$ mole, 20 equivalents) and THF (10 milliliters) were introduced in a 50 mL Schlenk flask equipped with a magnetic stirrer. The reaction mixture was purged with argon for 20 minutes in an ice bath to remove oxygen, and then heated at 70° C. After 20 hours, the polymer was recovered by double precipitation in hexane. The polymer was characterized by $^1$H NMR, UV-VIS, and SEC. A $^1$H NMR spectrum of the polymer is presented as FIG. 14. Normalized UV-VIS spectra of the polymer before and after RAFT end group removal are presented as FIG. 15.

Synthesis of Lower Molecular Weight LSEP.

In order to study the effect of molecular weight of LSEP additive on the dissolution ability, optical property and Lithographic performances, poly[(ECPMA-co-BzMA)-b-(MA-4-HFA-CHOH)] polymers with three different number average molecular weights (12,600, 6,600, and 4,800 Daltons) were synthesized. The synthesis routes were similar to those described above. The polymerization data is tabulated in Table 7. The data indicate that all polymerizations were well controlled. All three polymers exhibited a narrow dispersity.

TABLE 7

Polymerization data for Poly[(ECPMA-co-BzMA)-b-(MA-4-HFA-CHOH)] with different molecular weights

| Property | Polymer 1 | Polymer 2 | Polymer 3 |
|---|---|---|---|
| ECPMA % conversion, 1$^{st}$ block | 66.7 | 71.1 | 71.6 |
| BzMA % conversion, 1$^{st}$ block | 69.7 | 74.3 | 74.7 |
| $M_n$, 1$^{st}$ block | 12,200 | 5,600 | 3,000 |
| MA-4-HFA-CHOH % conversion, 2$^{nd}$ block | 87.5 | 93.2 | 83.5 |
| $M_w$, theoretical | 20,700 | 8,700 | 4,500 |
| ECPMA degree of polymerization | 32 | 14 | 7.2 |
| BzMA degree of polymerization | 34 | 15 | 7.8 |
| MA-4-HFA-CHOH degree of polymerization | 26 | 10 | 4.6 |
| $M_n$, NMR | 20,600 | 8,700 | 4,600 |
| $M_n$, SEC | 12,600 | 6,600 | 4,800 |
| $M_w$, SEC | 14,700 | 7,300 | 5,300 |
| Dispersity | 1.17 | 1.11 | 1.11 |

Electron Beam Lithography (EBL).

EBL analysis was conducted using a 7800 Field Emission Scanning Electron Microscope (FE-SEM) with a hot (Schottky) electron gun, which has a resolution (sample dependent) of 0.8 nm at 15 kV and 1.2 nm at 1 kV. It was equipped with a RAITH™ system for electron beam lithography. Samples were prepared as described in earlier sections ("Blending of photoresist polymer (CBP-4) with low surface energy polymer and quencher") and ("Spin coating process").

Figures 16A, 16B, 16C:
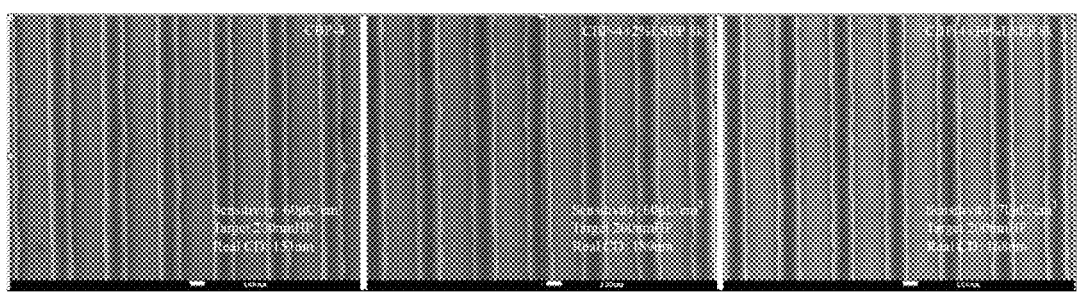
FIGS. 16A, 16B and 16C present scanning electron micrographs of line and space patterns for the resist formulated with FIG. 16A CBP-4, FIG. 16B CBP-4+2% LSEP 8k (where "LSEP 8k" is Polymer 2 in Table 7), and FIG. 16C CBP-4+10% LSEP 8k.

To determine the contribution of the LSEP to pattern quality, we compared the lithographic performance of resists with and without a LSEP top-layer. The scanning electron micrograph of the line and space patterns for the resist formulated with CBP-4, CBP-4+2% LSEP 8k (where "LSEP 8k" is Polymer 2 in Table 7) and CBP-4+10% LSEP 8k is shown in FIG. 16. These micrographs demonstrate that the resist shows smoother features in the presence of 2% LSEP 8k, compared with pure CBP-4. Furthermore, it was observed that there is no significant variation in sensitivity with the addition of 2% LSEP 8k compared with pure CBP-4. The dose-to-clear ($E_0$) for CBP-4 is 60 μC/cm², while in the case of CBP-4+2% LSEP 8k, the pattern is clear under the dose of 60 μC/cm² as well. However, size accuracy of CBP-4+2% LSEP 8k has been increased in comparison with CBP-4. The presence of LSEP 8k has improved the pattern quality of CBP-4 resist.

The invention claimed is:

1. A block copolymer comprising:
   a first block comprising repeat units derived from
      an out-of-band absorbing monomer comprising an unsubstituted or substituted $C_6$-$C_{18}$ aryl group that is free of fluorine, an unsubstituted or substituted $C_2$-$C_{17}$ heteroaryl group, a $C_5$-$C_{12}$ dienone group, or a combination thereof, and
      a base-solubility-enhancing monomer selected from the group consisting of acid-labile (meth)acrylate esters, base-labile (meth)acrylate esters, (meth)acrylate esters substituted with a group having a $pK_a$ of 2 to 12, and combinations thereof; and
   a second block having a surface energy of 15 to 34 millijoules per meter² determined using the Owens-Wendt method from the contact angles of 18 ohm deionized water, methylene iodide, and diethylene glycol, which are measured on a contact angle goniometer by the Sessile Drop method;

wherein a film cast from the block copolymer has an extinction coefficient, k, of 0.1 to 0.5 at a wavelength in the range of 150 to 400 nanometers.

2. The block copolymer of claim 1, having a dispersity ($M_w/M_n$) of 1.05 to 1.2.

3. The block copolymer of claim 1, wherein the out-of-band absorbing monomer has the structure

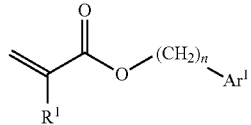

wherein
$R^1$ is hydrogen or methyl,
n is 0, 1, 2, 3, or 4, and
$Ar^1$ is an unsubstituted or substituted $C_6$-$C_{18}$ aryl group that is free of fluorine.

4. The block copolymer of claim 1, wherein the base-solubility-enhancing monomer comprises a tertiary (meth)acrylate ester.

5. The block copolymer of claim 1, wherein the second block is the product of polymerizing a monomer comprising
   a polymerizable moiety selected from the group consisting of vinyl, allyl, norbornenyl, (meth)acryloyl, dialcohol, dicarboxylic acid, diester, diisocyanate, combination of isocyanate and alcohol, silyl(dichloro)(hydrocarbyl), diacetylene, glycidyl, and hydroxyphenyl; and
   a low surface energy moiety selected from the group consisting of $C_{10}$-$C_{36}$ alkyl, $C_2$-$C_{12}$ dialkylsiloxane, and $C_1$-$C_{12}$ fluorinated alkyl.

6. The block copolymer of claim 1, wherein the second block comprises repeat units derived from a (meth)acrylate ester comprising at least one fluorine atom, and wherein the (meth)acrylate ester comprising at least one fluorine atom has the structure

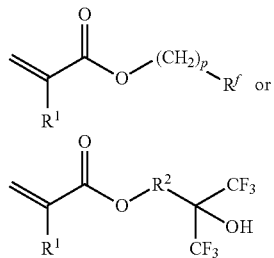

wherein
p is 0, 1, 2, 3, or 4,
$R^1$ is hydrogen or methyl,
$R^2$ is an unsubstituted or substituted $C_1$-$C_{18}$ hydrocarbylene group, and
$R^f$ is a $C_1$-$C_{18}$ hydrocarbyl group substituted with at least one fluorine atom and,
optionally, further substituted with substituents other than fluorine.

7. The block copolymer of claim 1, wherein the first block further comprises repeat units derived from a photoacid-generating monomer.

8. A photoresist composition comprising the block copolymer of claim 1.

9. The photoresist composition of claim 8, further comprising a photoacid generator.

10. The photoresist composition of claim 8, further comprising a quencher selected from the group consisting of $C_{1-30}$ amines, $C_{1-30}$ amides, and combinations thereof.

11. A film comprising the photoresist composition of claim 8, wherein the film has a thickness of 50 to 200 nanometers, wherein the film comprises a top surface in contact with air, and wherein at least 50 weight percent of the block copolymer in the film resides within 20 nanometers of the top surface.

12. A method of forming an electronic device, comprising:
   (a) applying a layer of a photoresist composition of claim 8 on a substrate;
   (b) pattern-wise exposing the photoresist composition layer to electron beam or extreme ultraviolet radiation; and
   (c) developing the exposed photoresist composition layer to provide a resist relief image.

\* \* \* \* \*